United States Patent
Marcus et al.

(10) Patent No.: US 6,911,671 B2
(45) Date of Patent: Jun. 28, 2005

(54) DEVICE FOR DEPOSITING PATTERNED LAYERS IN OLED DISPLAYS

(75) Inventors: Michael A. Marcus, Honeoye Falls, NY (US); Jeremy Grace, Penfield, NY (US); Justin H. Klug, Rochester, NY (US); Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/252,639

(22) Filed: Sep. 23, 2002

(65) Prior Publication Data

US 2004/0056244 A1 Mar. 25, 2004

(51) Int. Cl.[7] .......................... H01L 27/15; H01L 31/12; H01L 33/00
(52) U.S. Cl. .......................................... 257/79; 438/82
(58) Field of Search .......................... 257/79, 103, 24, 257/83, 43; 438/48, 69, 70, 71, 72, 73, 78, 82, 57, 61, 83, 27, 29, 24, 25, 99

(56) References Cited

U.S. PATENT DOCUMENTS

| | | | |
|---|---|---|---|
| 5,294,869 A | 3/1994 | Tang et al. | |
| 5,550,066 A | 8/1996 | Tang et al. | |
| 5,688,551 A | 11/1997 | Littman et al. | |
| 5,742,129 A | 4/1998 | Nagayama et al. | |
| 5,871,709 A | 2/1999 | Gries et al. | |
| 6,066,357 A | 5/2000 | Tang et al. | |
| 6,184,049 B1 * | 2/2001 | Watanabe et al. | 438/22 |
| 6,191,433 B1 * | 2/2001 | Roitman et al. | 257/40 |
| 6,337,102 B1 | 1/2002 | Forrest et al. | |
| 2003/0129784 A1 * | 7/2003 | Pakbaz et al. | |
| 2003/0146433 A1 * | 8/2003 | Cantwell et al. | |

* cited by examiner

Primary Examiner—Long Pham
Assistant Examiner—Dana Farahani
(74) Attorney, Agent, or Firm—Raymond L. Owens

(57) ABSTRACT

A new use for a structure including a plurality of nozzles extending through the structure, and the nozzles being spaced from each other in correspondence with the pattern to be deposited onto an OLED display substrate so that vaporized organic material is transported through the nozzles in a desired pattern for deposition onto the OLED display substrate.

10 Claims, 15 Drawing Sheets

DEVICE FOR DEPOSITING PATTERNED LAYERS IN OLED DISPLAYS

CROSS REFERENCE TO RELATED APPLICATIONS

Reference is made to commonly assigned U.S. patent application Ser. No. 10/252,343 filed Sep. 23, 2002, by Michael A. Marcus et al., entitled "Despositing Layers in OLED Devices using Viscous Flow ", the disclosure of which is herein incorporated by reference.

FIELD OF THE INVENTION

The present invention relates to forming patterned organic light-emitting layers in making a multicolor OLED display or full-color OLED display, and more particularly to vapor depositing such patterned layers without requiring precision shadow masks.

BACKGROUND OF THE INVENTION

An organic light-emitting diode (OLED) device, also referred to as an organic electroluminescent device, can be constructed by sandwiching two or more organic layers between first and second electrodes.

In single-color OLED devices or displays, also called monochrome OLEDs, these organic layers are not patterned but are formed as continuous layers.

In multicolor OLED devices or displays or in full-color OLED displays, an organic hole-injecting and hole-transporting layer is formed as a continuous layer over and between the first electrodes. A pattern of one or more laterally adjacent organic light-emitting layers are then formed over the continuous hole-injecting and hole-transporting layer. This pattern, and the organic materials used to form the pattern, is selected to provide multicolor or full-color light-emission from a completed and operative OLED display in response to electrical potential signals applied between the first and second electrodes.

An unpatterned organic electron-injecting and electron-transporting layer is formed over the patterned light-emitting layers, and one or more second electrodes are provided over this latter organic layer.

Providing a patterned organic light-emitting layer capable of emitting light of two different colors (multicolor) or of three different colors, for example, the primary colors of red (R), green (G), and blue (B), is also referred to as color pixelation since the pattern is aligned with pixels of an OLED display. The RGB pattern provides a full-color OLED display.

Various processes have been proposed to achieve color pixelation in OLED imaging panels. For example, Tang et al. in commonly assigned U.S. Pat. No. 5,294,869 discloses a process for the fabrication of a multicolor OLED imaging panel using a shadow masking method in which sets of pillars or walls made of electrically insulative materials form an integral part of the device structure. A multicolor organic electroluminescent ("EL") medium is vapor deposited and patterned by controlling an angular position of a substrate with respect to a deposition vapor stream. The complexity of this process resides in the requirements that the integral shadow mask have multilevel topological features, which may be difficult to produce, and that angular positioning of the substrate with respect to one or more vapor sources must be controlled.

Littman et al. in commonly assigned U.S. Pat. No. 5,688,551 recognized the complexity of the above described Tang et al. process, and discloses a method of forming a multicolor organic EL display panel in which a close-spaced deposition technique is used to form a separately colored organic EL medium on a substrate by patternwise transferring the organic EL medium from a donor sheet to the substrate. The donor sheet includes a radiation-absorbing layer which can be unpatterned or which can be prepatterned in correspondence with a pattern of pixels or subpixels on the substrate. The donor sheet has to be positioned either in direct contact with a surface of the substrate or at a controlled relatively small distance from the substrate surface to minimize the undesirable effect of divergence of the EL medium vapors issuing from the donor sheet upon heating the radiation-absorbing layer.

In general, positioning an element such as, for example, a donor sheet or a mask, in direct contact with a surface of a substrate can invite problems of abrasion, distortion, or partial lifting of a relatively thin and mechanically fragile organic layer which has been formed previously on the substrate surface. For example, an organic hole-injecting and hole-transporting layer may be formed over the substrate prior to deposition of a first-color pattern. In depositing a second-color pattern, direct contact of a donor sheet or a mask with the first-color pattern may cause abrasion, distortion, or partial lifting of the first-color pattern.

Positioning a donor sheet or a mask at a controlled distance from the substrate surface may require incorporation of spacer elements on the substrate, or on the donor sheet or the mask, or on the substrate and on the donor sheet. Alternatively, special fixtures may have to be devised to provide for a controlled spacing between the substrate surface and a donor sheet or a mask.

The potential problems or constraints also apply to disclosures by Grande et al. in commonly assigned U.S. Pat. No. 5,871,709 which describes a method for patterning high-resolution organic EL displays, as well as to teachings by Nagayama et al. in U.S. Pat. No. 5,742,129 which discloses the use of shadow masking in manufacturing an organic EL display panel.

The above described potential problems or constraints are overcome by disclosures of Tang et al. in commonly assigned U.S. Pat. No. 6,066,357 which teaches methods of making a full-color OLED display. The methods include ink-jet printing of fluorescent dopants selected to produce red, green, or blue light emission from designated subpixels of the display. The dopants are printed sequentially from ink-jet printing compositions which permit printing of dopant layers over an organic light-emitting layer containing a host material selected to provide host light emission in a blue spectral region. The dopants are diffused from the dopant layer into the light-emitting layer.

The ink-jet printing of dopants does not require masks, and surfaces of ink-jet print heads are not contacting a surface of the organic light-emitting layer. However, the ink-jet printing of dopants is performed under ambient conditions in which oxygen and moisture in the ambient air can result in partial oxidative decomposition of the uniformly deposited organic light-emitting layer containing the host material. Additionally, direct diffusion of a dopant, or subsequent diffusion of a dopant, into the light-emitting layer can cause partial swelling and attendant distortion of the domains of the light-emitting layer into which the dopant was diffused.

OLED imaging displays can be constructed in the form of so-called passive matrix devices or in the form of so-called active matrix devices.

In a passive matrix OLED display of conventional construction, a plurality of laterally spaced light-transmissive anodes, for example, indium-tin-oxide (ITO) anodes are formed as first electrodes on a light-transmissive substrate such as, for example, a glass substrate. Three or more organic layers are then formed successively by vapor deposition of respective organic materials from respective vapor sources, within a chamber held at reduced pressure, typically less than $10^{-3}$ Torr ($1.33 \times 10^{-1}$ Pa). A plurality of laterally spaced cathodes is deposited as second electrodes over an uppermost one of the organic layers. The cathodes are oriented at an angle, typically at a right angle, with respect to the anodes.

Such conventional passive matrix OLED displays are operated by applying an electrical potential (also referred to as a drive voltage) between an individual row (cathode) and, sequentially, each column (anode). When a cathode is biased negatively with respect to an anode, light is emitted from a pixel defined by an overlap area of the cathode and the anode, and emitted light reaches an observer through the anode and the substrate.

In an active matrix OLED display, an array of sets of thin-film transistors (TFTs) is provided on a light-transmissive substrate such as, for example, a glass substrate. One TFT, respectively, of each of the sets of TFTs is connected to a corresponding light-transmissive anode pad, which can be made, for example, of indium-tin-oxide (ITO). Three or more organic layers are then formed successively by vapor deposition in a manner substantially equivalent to the construction of the aforementioned passive matrix OLED display. A common cathode is deposited as a second electrode over an uppermost one of the organic layers. The construction and function of an active matrix OLED display is described in commonly assigned U.S. Pat. No. 5,550,066.

In order to provide a multicolor or a full-color (red, green, and blue subpixels) passive matrix or active matrix OLED display, color pixelation of at least portions of an organic light-emitting layer is required.

Color pixelation of OLED displays can be achieved through various methods as detailed above. One of the most common current methods of color pixelation integrates the use of one or more of the described vapor sources and a precision shadow mask temporarily fixed in reference to a device substrate. Organic light-emitting material, such as that used to create an OLED emitting layer, is sublimed from a source (or from multiple sources) and deposited on the OLED substrate through the open areas of the aligned precision shadow mask. This physical vapor deposition (PVD) for OLED production is achieved in vacuum through the use of a heated vapor source containing vaporizable organic OLED material. The organic material in the vapor source is heated to attain sufficient vapor pressure to effect efficient sublimation of the organic material, creating a vaporous organic material plume that travels to and deposits on an OLED substrate. A variety of vapor sources based on different operating principles exist, including the so-called point sources (heated small sublimation cross-sectional area sources) and linear sources (sources of large sublimation cross-sectional area). Multiple mask-substrate alignments and vapor depositions are used to deposit a pattern of differing light-emitting layers on desired substrate pixel areas or subpixel areas creating, for example, a desired pattern of red, green, and blue pixels or subpixels on an OLED substrate. Note that in this method which is commonly used in OLED production not all of the vaporized material present in the vaporous material plume is deposited onto desired areas of the substrate. Instead much of the material plume is deposited onto various vacuum chamber walls, shielding, and precision shadow masks. This leads to poor material utilization factors and consequently high materials cost.

While precision shadow masking is a feasible method for OLED production, it also effects many complications and potential predicaments to display manufacturing. First, care must be taken in positioning and removing these masks onto and from a device substrate to avoid physical damage to OLED devices. Second, when vacuum depositing large area substrates it is difficult to keep shadow masks in intimate contact at all places along the length of the substrate, which can lead to unfocussed depositions or mask induced substrate physical damage. Third, when vacuum depositing three colored regions at different locations on the substrate, three sets of precision shadow masks may be needed and can cause unwanted delays in OLED production. Fourth, keeping mask to substrate precision alignment with the required accuracy along the length of large substrates is very difficult for several reasons, including mask and substrate thermal expansion mismatches, small pixel pitches, and mask fabrication limitations. Also, when vacuum depositing multiple substrates during a single vacuum pump down cycle, material residue can build up on shadow masks and can eventually cause defects to form in the pixels being deposited.

SUMMARY OF THE INVENTION

It is an object of the present invention to provide a device for depositing vaporized material, such as organic material, onto a surface.

It is another object of the present invention to provide a device for depositing in a pattern an organic light-emitting layer onto an OLED display substrate.

These objects are achieved in a device for depositing in a pattern an organic light-emitting layer onto an OLED display substrate, comprising:

a) a manifold and an OLED display substrate in a chamber at reduced pressure and spaced relative to each other;

b) a structure sealingly covering an upper surface of the manifold, the structure including a plurality of nozzles extending through the structure into the manifold, and the nozzles being spaced from each other in correspondence with the pattern to be deposited onto the OLED display substrate;

c) means for providing organic material into the manifold; and e) means for applying an inert gas under pressure into the manifold so that the inert gas provides a viscous gas flow through each of the nozzles, such viscous gas flow transporting at least portions of the vaporized organic light-emitting materials from the manifold through the nozzles to provide collimated beams of the inert gas and of the vaporized organic light-emitting materials and projecting the collimated beams onto the OLED display substrate for depositing a pattern of an organic light-emitting layer on the substrate.

This object is also achieved by a new use for a structure including a plurality of nozzles extending through the structure, and the nozzles being spaced from each other in correspondence with the pattern to be deposited onto an OLED display substrate so that vaporized organic material is transported through the nozzles in a desired pattern for deposition onto the OLED display substrate.

ADVANTAGES

A feature of the present invention is that a pattern of vaporized material, such as organic material, can be deposited without the use of shadow mask.

Another feature of the present invention is that a plurality of devices can be used for simultaneously depositing different organic materials. Such organic materials can emit light in different ranges of the spectrum.

DETAILED DESCRIPTION OF THE INVENTION

The drawings are necessarily of a schematic nature since layer thickness dimensions of OLEDs are frequently in the sub-micrometer ranges, while features representing lateral device dimensions can be in a range of 25–2000 millimeter. Furthermore, the plurality of nozzles formed in the nozzle plate(s) or structure(s) is relatively small in size when compared to a length dimension over which the nozzles extend. Accordingly, the drawings are scaled for ease of visualization rather than for dimensional accuracy.

The term "display" or "display panel" is employed to designate a screen capable of electronically displaying video images or text. The term "pixel" is employed in its art-recognized usage to designate an area of a display panel that can be stimulated to emit light independently of other areas. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel that can be independently addressable to emit a specific color. For example, a blue subpixel is that portion of a pixel that can be addressed to emit blue light. In a full-color display, a pixel generally comprises three primary color subpixels, namely red, green, and blue, frequently abbreviated to "RGB". The term "pitch" is used to designate the distance separating two pixels or subpixels in a display panel. Thus, a subpixel pitch means the separation between two subpixels. The term "inert gas" denotes a gas, which is chemically non-reactive toward organic vapors and toward organic layers formed on OLED display substrates.

Figure 1:
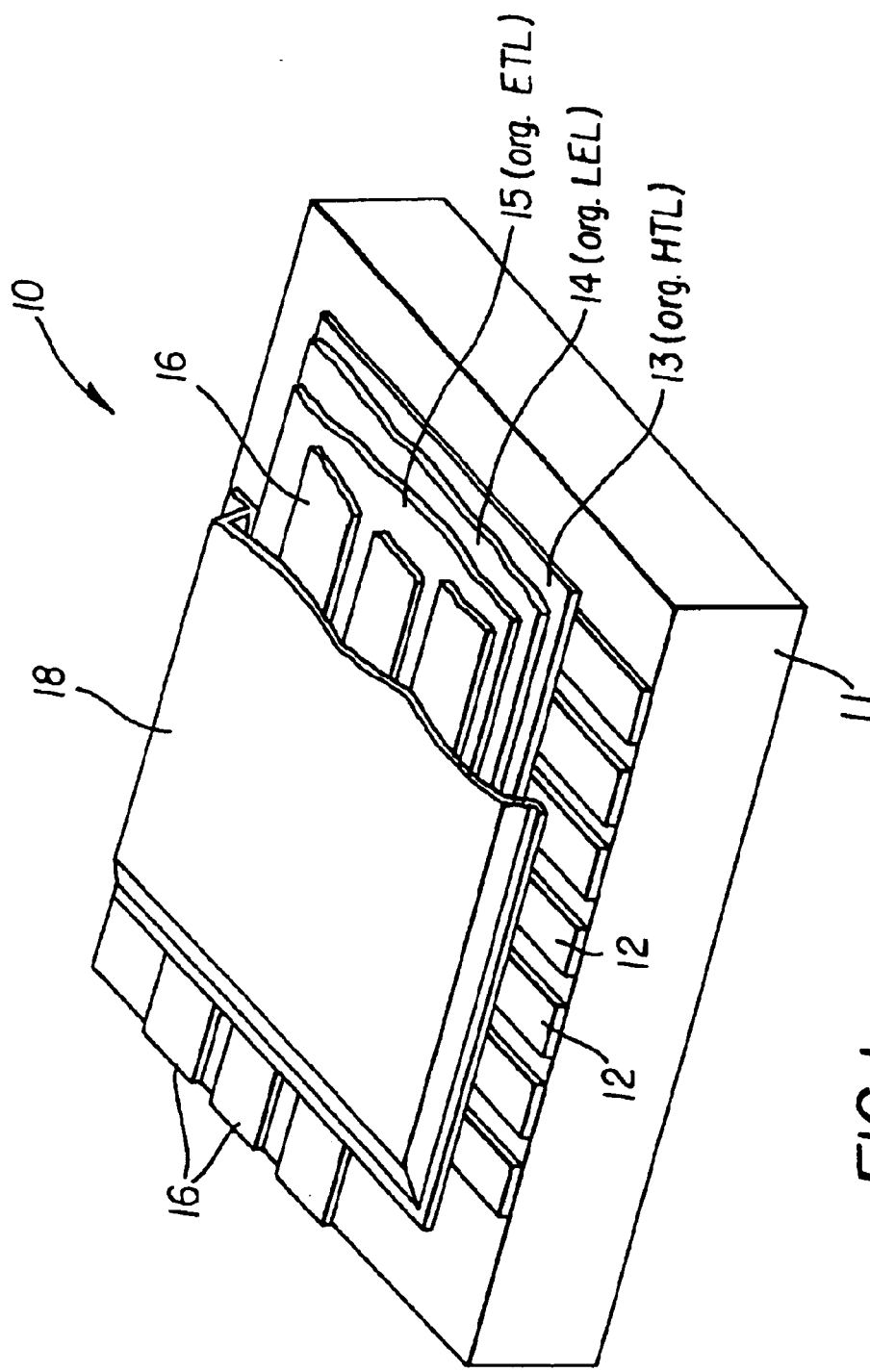
FIG. 1 is a schematic perspective view of a passive matrix OLED display having partially peeled-back elements to reveal various layers.

Turning to FIG. 1, a schematic perspective view of a passive matrix OLED display 10 is shown having partially peeled-back elements to reveal various layers.

A light-transmissive substrate 11 has formed thereon a plurality of laterally spaced first electrodes 12 (also referred to as anodes). An organic hole-transporting layer (HTL) 13, an organic light-emitting layer (LEL) 14, and an organic electron-transporting layer (ETL) 15 are formed in sequence by a physical vapor deposition, as will be described in more detail hereinafter. A plurality of laterally spaced second electrodes 16 (also referred to as cathodes) are formed over the organic electron-transporting layer 15, and in a direction substantially perpendicular to the first electrodes 12. An encapsulation or cover 18 seals environmentally sensitive portions of the device, thereby providing a completed OLED 10.

Figure 2:
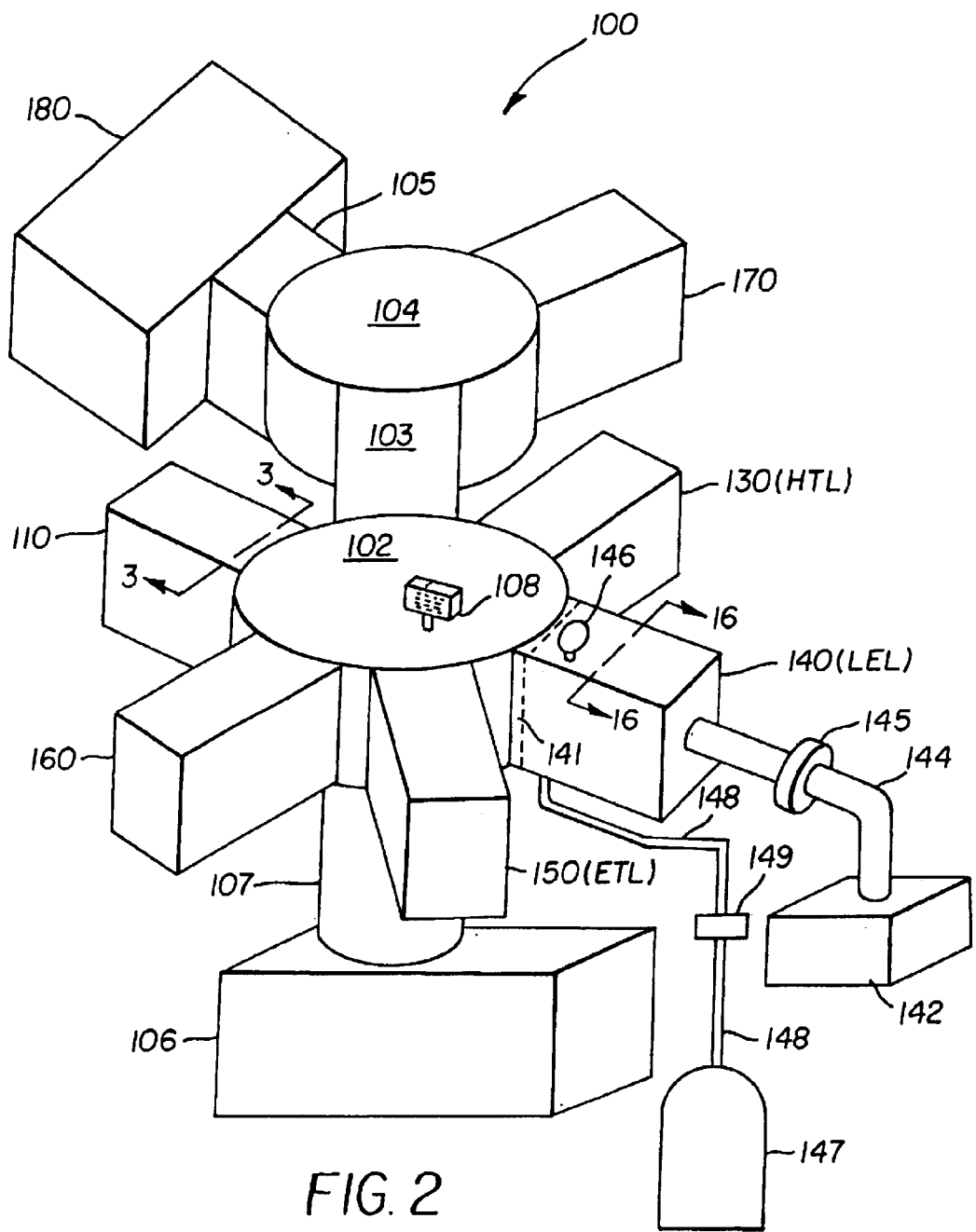
FIG. 2 is a schematic perspective view of an OLED apparatus suitable for making a relatively large number of OLED displays and having a plurality of stations extending from hubs.

Turning to FIG. 2, a schematic perspective view of an OLED apparatus 100 is shown which is suitable for making a relatively large number of organic light-emitting devices or displays using automated or robotic means (not shown) for transporting or transferring substrates among a plurality of stations extending from a buffer hub 102 and from a transfer hub 104. A vacuum pump 106 via a pumping port 107 provides reduced pressure within the hubs 102, 104, and within each of the stations extending from these hubs, except for station 140. A pressure gauge 108 indicates the reduced pressure within the apparatus 100. The pressure is typically lower than $10^{-3}$ Torr ($1.33 \times 10^{-1}$ Pascal) and can be as low as $10^{-6}$ Torr ($1.33 \times 10^{-4}$ Pascal).

The stations include a load station 110 for providing a load of substrates, a vapor deposition station 130 dedicated to forming organic hole-transporting layers (HTL) which may include organic hole-injecting sub-layers, a vapor deposition station 140 dedicated to forming organic light-emitting layers (LEL), a vapor deposition station 150 dedicated to forming organic electron-transporting layers (ETL), a vapor deposition station 160 dedicated to forming the plurality of second electrodes (cathodes), an unload station 103 for transferring substrates from the buffer hub 102 to the transfer hub 104 which, in turn, provides a storage station 170, and an encapsulation station 180 connected to the hub 104 via a connector port 105. Each of these stations, except for LEL station 140, has an open port extending into the hubs 102 and 104, respectively, and each station has a vacuum-sealed access port (not shown) to provide access to a station for cleaning, and for replacement or repair of parts. Each station includes a housing, which defines a chamber.

The inventive method of color pixelating organic layers in making an OLED display uses directed beams which are generated by inducing viscous flow of an inert gas through nozzles, the viscous gas flow transporting with it vapors of organic materials. Depending on the number and inside dimensions of the nozzles, as well as the gas flow required to achieve directed beams, the "gas loading" of LEL station 140 can be relatively high. Such relatively high "gas loading" could adversely affect the functioning of other stations of the OLED apparatus 100.

In order to prevent such potentially adverse effects on other stations and hubs of the OLED apparatus 100, the LEL station 140 is adapted to isolate this station during color pixelation. Isolation is achieved by: (i) a station valve 141, shown in dashed outline proximate the buffer hub 102, is normally in a closed position. Station valve 141 is opened only to permit transfer of a substrate from the buffer hub into station 140, and again to transfer a completed substrate, i.e. a color pixelated substrate, from station 140 into the buffer hub 102; and (ii) a station vacuum pump 142 is connected to station 140 via a station pumping port 144 which includes a throttle valve 145. The throttle valve can be controlled to be in a fully open position, throttled to a partially open position, or to be in a closed position. A station pressure sensor 146 indicates the pressure within a chamber of station 140.

Prior to substrate transfer(s) the throttle valve 145 is adjusted so that substantially identical pressure indications are obtained from station pressure sensor 146 and from pressure gauge 108 of the OLED apparatus 100, and the station valve 141 can then be opened.

Upon transfer of a substrate from the hub 102 into the chamber (140C) of station 140, the station valve 141 is closed and the throttle valve 145 is opened to provide for evacuation of the chamber (140C) to an initial pressure in a range from $10^{-7}$ to $10^{-5}$ Torr ($1.33 \times 10^{-5}$ to $1.33 \times 10^{-3}$ Pa) in order to remove traces of oxygen and moisture from the chamber.

Prior to color pixelation, inert gas may optionally be admitted into the chamber (140C) from an inert gas supply 147 via a conduit 148 including a gas flow controller 149. The throttle valve 145 is throttled to a position so that the gas pressure ($P_c$) in the chamber equilibrates to a selected level in a range from about $10^{-7}$ to $10^0$ Torr. The gas pressure level in the chamber is lower than the pressure of an inert gas, which is used to cause viscous flow in the nozzles (506) to provide the directed beams.

Figure 3:
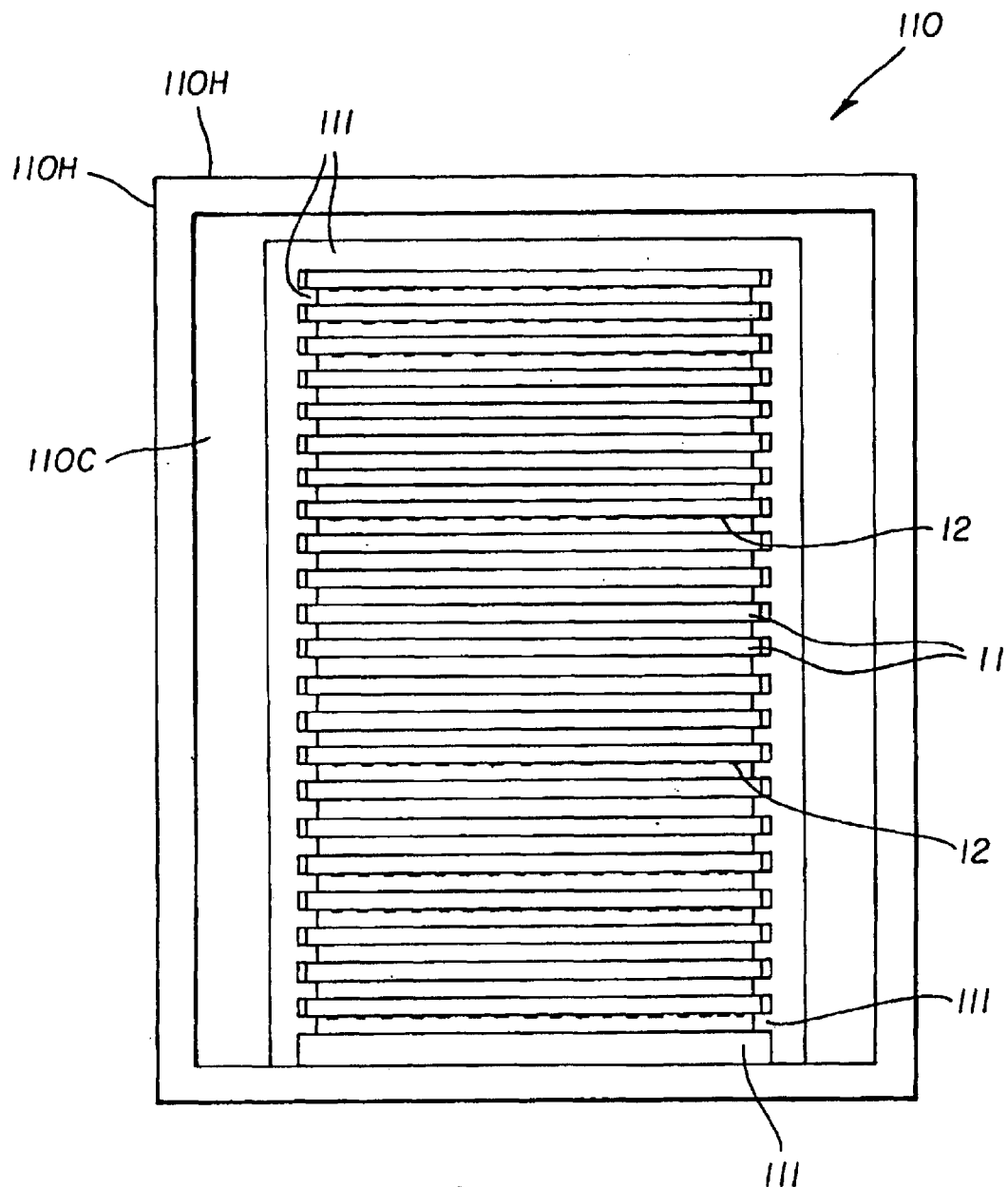
FIG. 3 is a schematic section view of a carrier containing a relatively large number of substrates or structures, and positioned in a load station of the apparatus of FIG. 2 as indicated by section lines 3—3 in FIG. 2.

FIG. 3 is a schematic section view of the load station 110, taken along section lines 3—3 of FIG. 2. The load station 110 has a housing 110H, which defines a chamber 110C. Within the chamber is positioned a carrier 111 designed to carry a plurality of substrates 11 having preformed first electrodes 12 (see FIG. 1 and FIGS. 4–5). An alternative carrier 111 can be provided for supporting a plurality of active matrix substrates 51 (see FIG. 7). Carriers 111 can also be provided in the unload station 103 and in the storage station 170.

Figure 4:
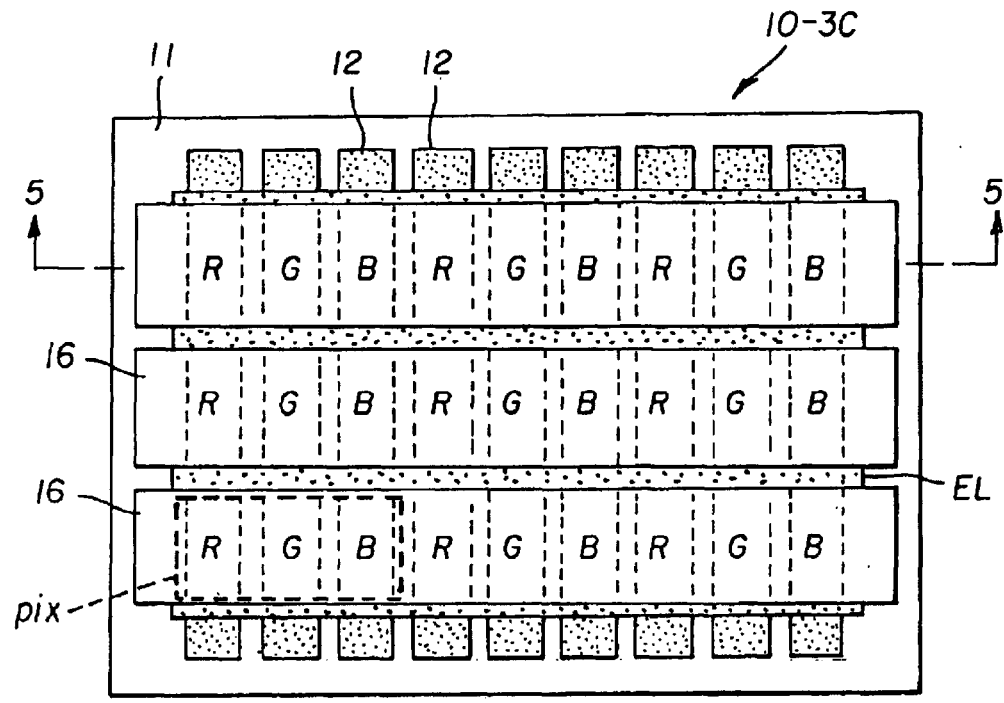
FIG. 4 is a schematic top view of a full-color (RGB) passive matrix OLED display that can be color pixelated by the method of the present invention.

Turning to FIG. 4, a schematic top view of a full-color (RGB) passive matrix OLED display 10-3C is shown which can be color pixelated by the method of the present invention. Like numeral designations correspond like parts or functions given in the description of FIG. 1. Each pixel (labeled pix in FIG. 4) comprises three adjacent subpixels, labeled R, G, and B. Each subpixel is formed at the intersection of a column electrode or anode 12 and a row electrode or cathode 16. Each subpixel can be addressed independently to emit a specific color. For example, a subpixel labeled R has an organic EL medium, which emits red light. Likewise, the subpixels labeled G and B have organic EL media, which emit green and blue light, respectively. Each pixel, therefore, has three independently addressable column electrodes 12 (anodes) and one addressable row electrode 16, and the OLED display 10-3C has three times as many column electrodes or anodes 12 as row electrodes or cathodes 16. Note that a simple column stripe pattern is shown in FIG. 4, but more complicated pixel patterns such as the commonly used delta pattern, is also possible.

FIG. 4 shows a limited number of pixels (pixes). In principle, the number of pixels is limited only by the size of the substrate 11 upon which the display 10-3C is fabricated. The pixel resolution, or the number density of pixels can be made quite high, limited only by the resolution of the patterning method to produce color pixelation. Using the directed beam deposition of the present invention can permit pixel resolution as high as 50 pixels per millimeter.

In one type of OLED display, commonly called a bottom emitting display, a selected pattern of light emission from the OLED display 10-3C is produced which can be observed by viewing the bottom surface of the light-transmissive substrate 11. In a preferred mode of operation, the panel is stimulated to emit light by sequentially stimulating one row of pixels at a time and repeating the stimulating sequence at a rate chosen so that the interval between repeated stimulation of each row is less than the detection limit of the human visual system, typically less than about $1/60^{th}$ of a second. An observer sees an image formed by emission from all stimulated rows, even though the panel at any instant in time is emitting light from addressed subpixels in only one row.

The RGB color pixelation of the OLED panel 10-3C is shown as a stripe pattern in which each of the R, G, and B stripes produces light emission only from areas defined by the intersection of a column electrode (anode) 12 and a row electrode (cathode) 16 when stimulated, even though the definition of a pixel pix includes the non-emitting gaps (not labeled in FIG. 4) between the anodes 12.

Figure 5:
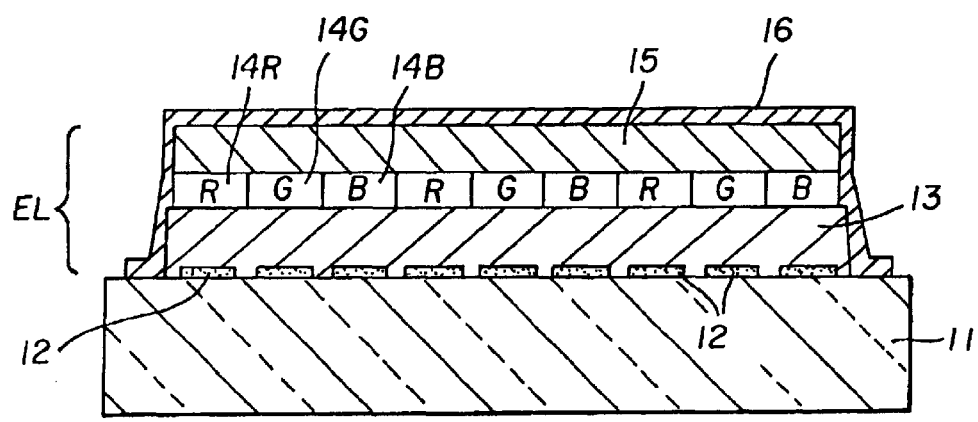
FIG. 5 is a schematic sectional view of the OLED display, taken along the section lines 5—5 of FIG. 4.

FIG. 5 is a schematic sectional view of the OLED display, taken along the section lines 5—5 of FIG. 4. The EL medium includes an organic hole-transporting layer 13 formed as a continuous layer over and between the anode column electrodes 12 which are provided on the substrate 11. The hole-transporting layer can include a hole-injecting sublayer (not shown) formed first over and between the anodes. Organic light-emitting subpixel layers 14R, 14G, and 14B are formed over the hole-transporting layer. An organic electron-transporting layer 15 is formed as a continuous layer over the color pixelated layers, and can include an overlaying electron-injecting layer (not shown) in contact with the cathode row electrode(s) 16.

Figure 6:
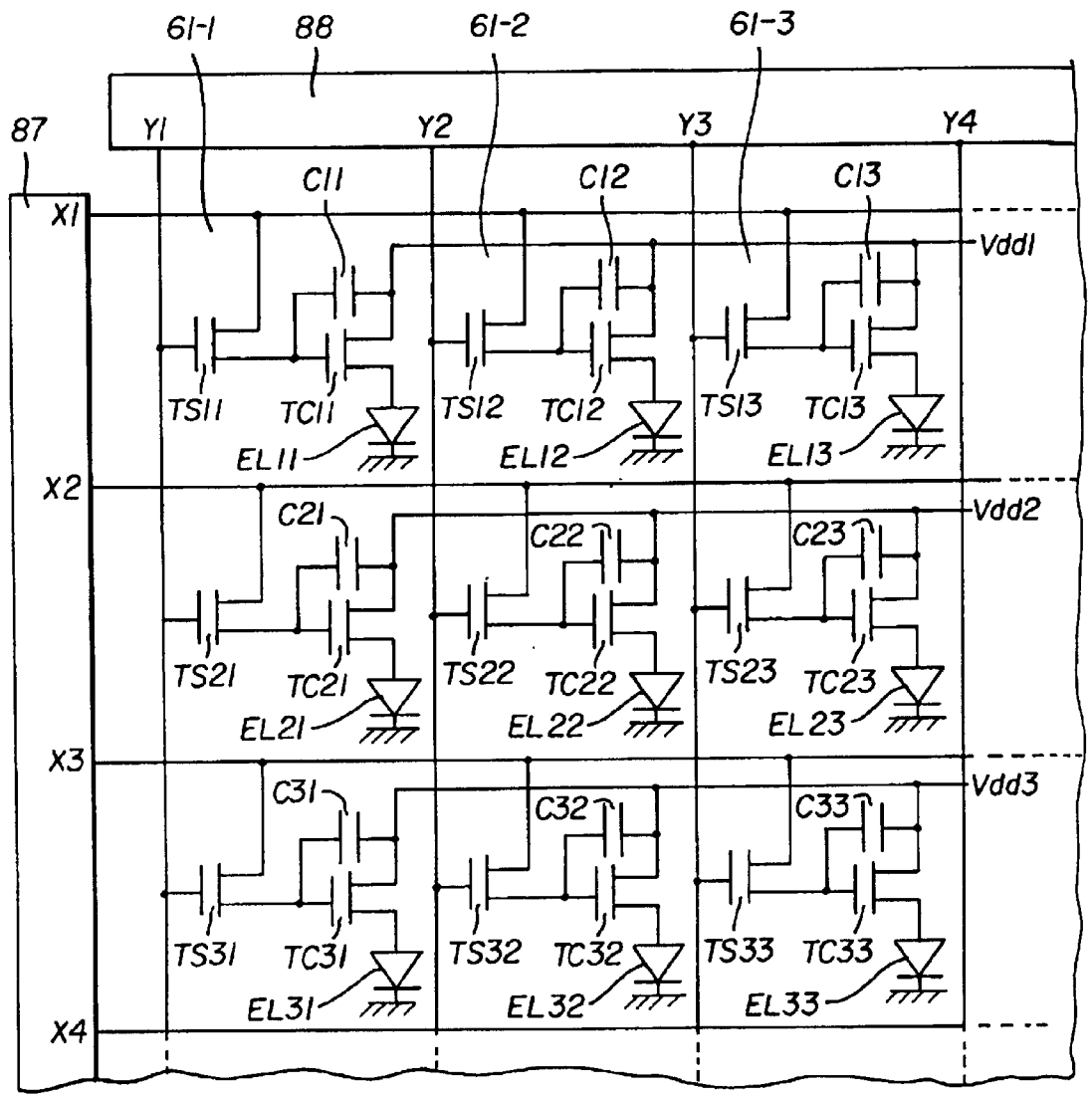
FIG. 6 is a circuit diagram of repeating units of a portion of an active matrix OLED display.
Figure 7:
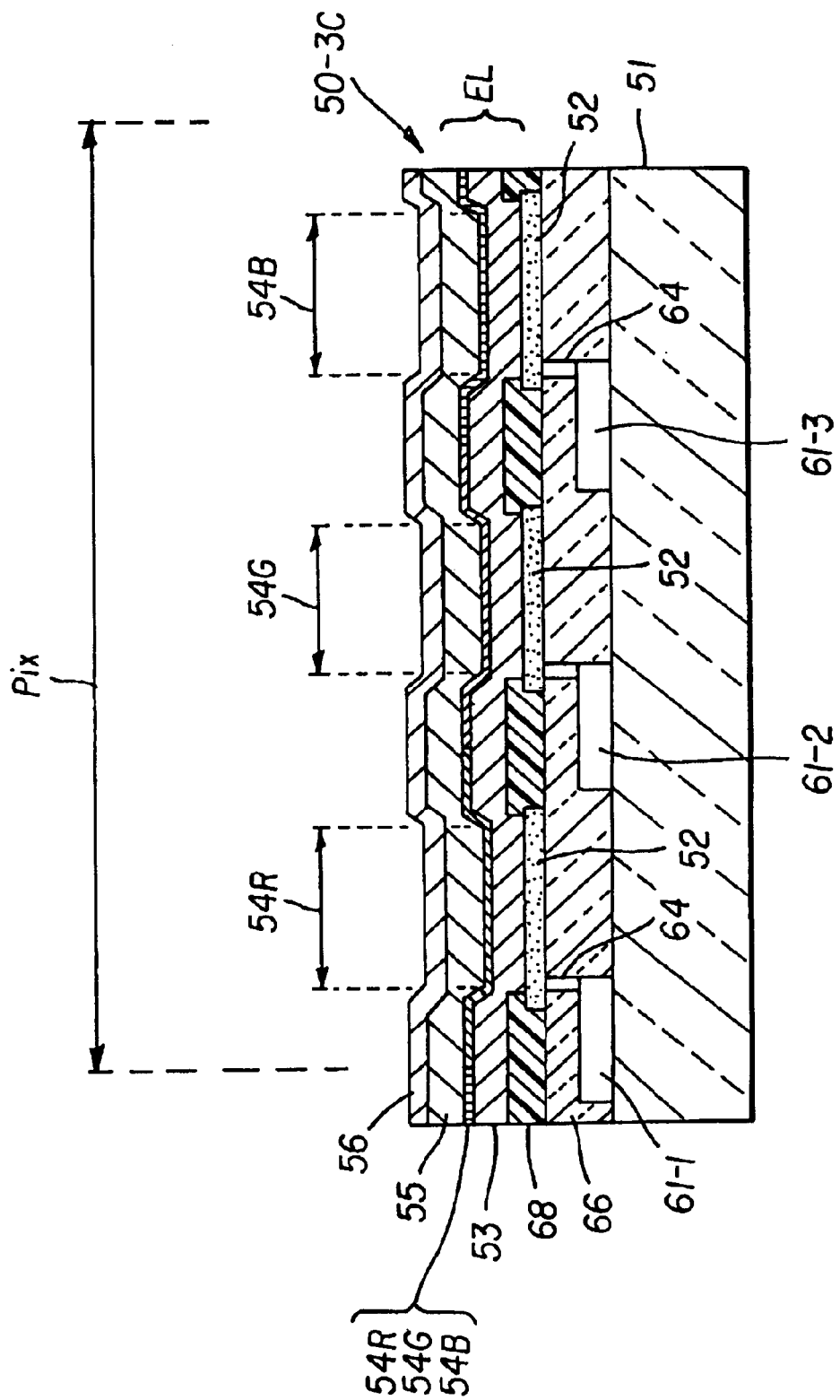
FIG. 7 is a schematic sectional view of an active matrix OLED display having RGB color pixelation of the light-emitting layer which can be formed by the method of the present invention.

Turning to FIG. 6, a circuit diagram of a portion of an active matrix OLED display is depicted. Each one of repeating subpixel circuits includes a thin-film switching transistor TSnm where n, m are integers which define the specific location of the subpixel circuit formed on a light-transmissive substrate 51 (see FIG. 7). For example, TS12 is a thin-film switching transistor associated with a subpixel circuit located in a row 1 and in a position 2 or a column 2 of that row. Each subpixel circuit further includes a thin-film transistor TCnm for power control, a thin-film capacitor Cnm, and an organic EL medium ELnm which are depicted as diodes. Power supply lines Vddn, X-direction signal lines (including lines X1 to Xn, where n is an integer), and Y-direction signal lines (including lines Y1 to Ym, where m is an integer) provide electrical potentials and signal addressing capability, respectively, to each subpixel circuit. Circuits in row 1, defined by signal addressing lines X1 and Y1–Y3, are indicated as 61-1, 61-2, and 61-3, respectively, and like numeral designations are used in FIG. 7. The X-direction signals lines X1, X2, X3, . . . Xn are connected to an X-direction driving circuit 87, and the Y-direction signals lines Y1, Y2, Y3, . . . Ym are connected to a Y-direction driving circuit 88. To provide light emission, for example, from the EL medium EL 12, signals are provided at X-direction signal line X1 and at Y-direction signal line Y2, thereby actuating the thin-film switching transistor TS12 into an "on" state. In turn, the thin-film transistor for power control TC12 comes into an "on" state and induces electric current flow through the EL medium EL12 provided via the power supply line Vdd1. Thus, light is emitted by the OLED EL12. Why here FIG. 7 is a schematic sectional view of the portion of subpixels 61-1, 61-2, and 61-3 indicated in FIG. 6, and showing a full-color pixelated EL medium in which RGB color pixelation of the light-emitting layer is designated at 54R, 54G, and 54B, respectively. Color pixelation can be achieved by the method of the invention.

On a light-transmissive substrate 51 are provided the subpixel circuit elements (thin-film transistors, thin-film capacitor, and electrical wiring) 61-1, 61-2, and 61-3. Conductive wiring 64 provides an electrical connection (from a thin-film transistor for power control) to a light-transmissive first electrode or anode pad 52 which can be constructed of indium-tin-oxide (ITO). A light-transmissive organic insulator layer 66 provides electrical insulation. A second organic insulator layer 68 encases edges and portions of upper surfaces of the pads 52.

The organic EL medium is then formed, comprised of, in sequence, a continuous organic hole-injecting and hole-transporting layer 53, the color pixelated organic light-emitting layers 54R, 54G, and 54B, and a continuous electron-transporting layer 55. A common second electrode or cathode 56 is formed in contact with the electron-transporting layer 55. Effective dimensions of light emission from subpixels are indicated by arrows extending between dashed lines, while a pixel pix includes not only these light emission portions but also non-emissive raised portions which extend between the recessed light emission portions 54R, 54G, and 54B.

Figure 8:
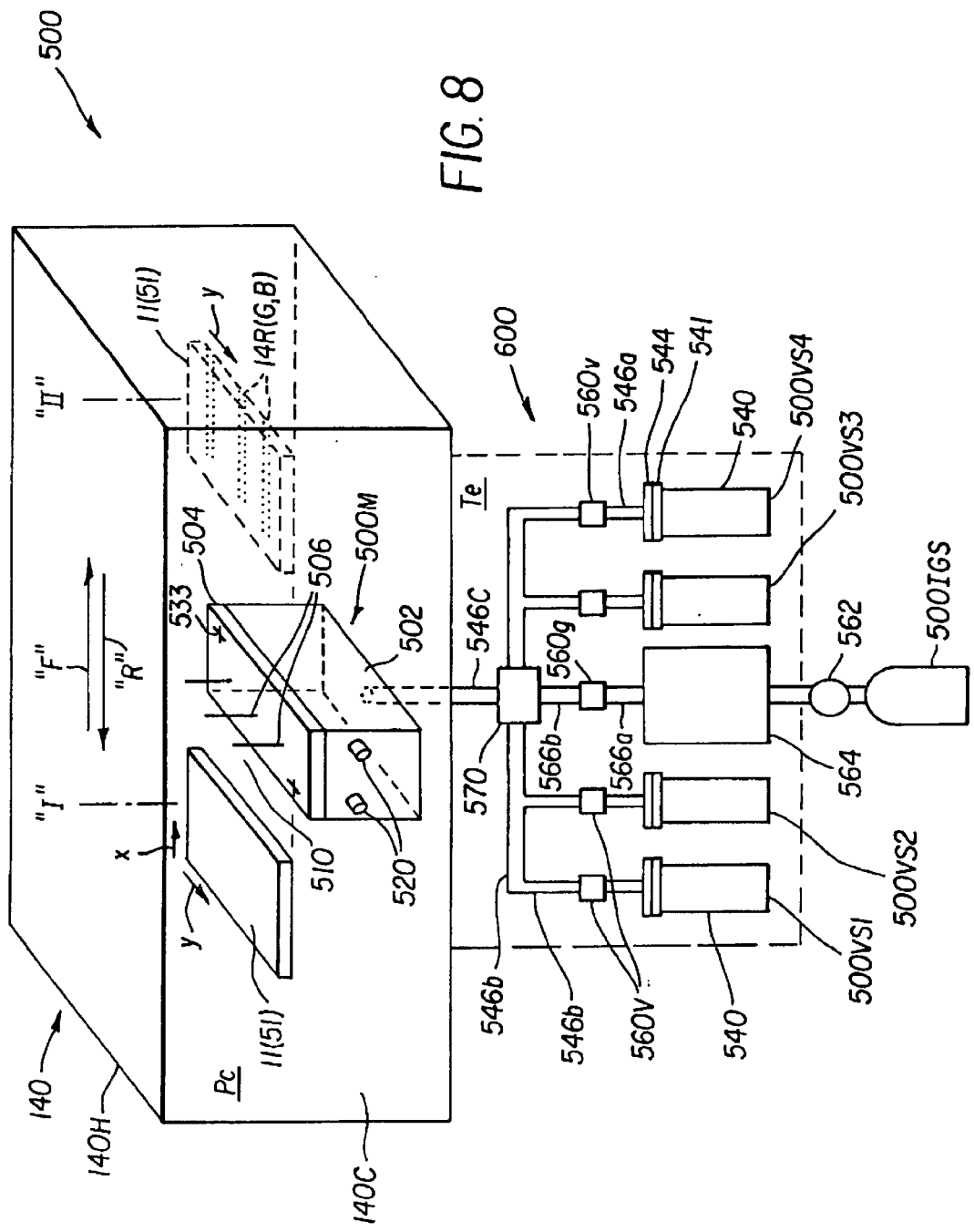
FIG. 8 is a schematic rendition of a vapor deposition apparatus by which the present invention can be practiced, and including a chamber in which are disposed a substrate and a manifold having a structure or nozzle plate covering the manifold and including nozzles for producing directed vapor beams, and a plurality of vapor sources and an inert gas supply disposed outside of the chamber and connected to the manifold.

Turning to FIG. 8, a schematic rendition of a vapor deposition apparatus 500 is shown which is useful in practicing the present invention. The station 140 of FIG. 2 has a housing 140H which defines a chamber 140C which is held at a reduced pressure $P_c$ as described with reference to FIG. 2. In order to preserve clarity of the drawing, the station valve 141, the station vacuum pump 142 and associated pumping port 144 and throttle valve 145, the station pressure sensor 146, as well as the inert gas supply 147 with conduits 148 and gas flow controller 149, have been omitted in FIG. 8. Moreover, depending on the material in the substrate 11 (51), manifold-to-substrate spacing and deposition temperatures, the substrate may have to be cooled and, for convenience of illustration, a cooling structure has also not been shown.

Disposed in the chamber 140C is a manifold 500M which includes a manifold housing 502 which is sealingly covered on at least one surface by a structure which is also referred to as a nozzle plate 504. The nozzle plate has a plurality of nozzles 506, which extend into the manifold. The structure or nozzle plate has alignment marks 533 formed on one surface which serve to align an OLED display substrate 11 (51) with respect to the nozzles prior to vapor depositing the first one of a color pixelated organic light-emitting layer 14R, 14G, or 14B as a stripe pattern on the substrate. It is understood that the substrate 11 (51) includes an organic hole-injecting and hole-transporting layer (HTL) 13 or 53.

Figure 16:
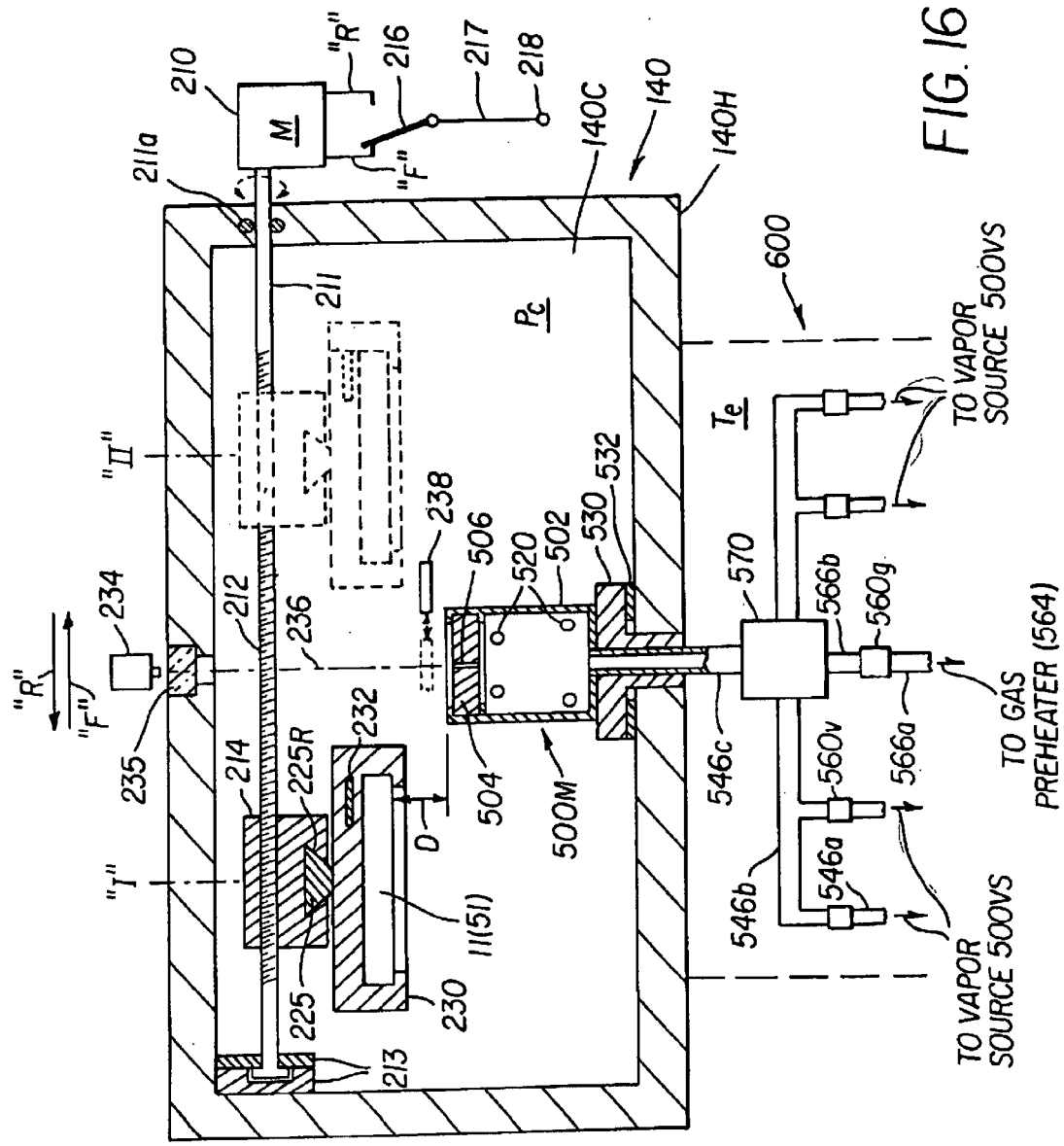
FIG. 16 is a schematic sectional view of the LEL vapor deposition station of FIG. 2, and indicating motion of the substrate from a first position, over and past the nozzles, and into a second position.
Figure 17:
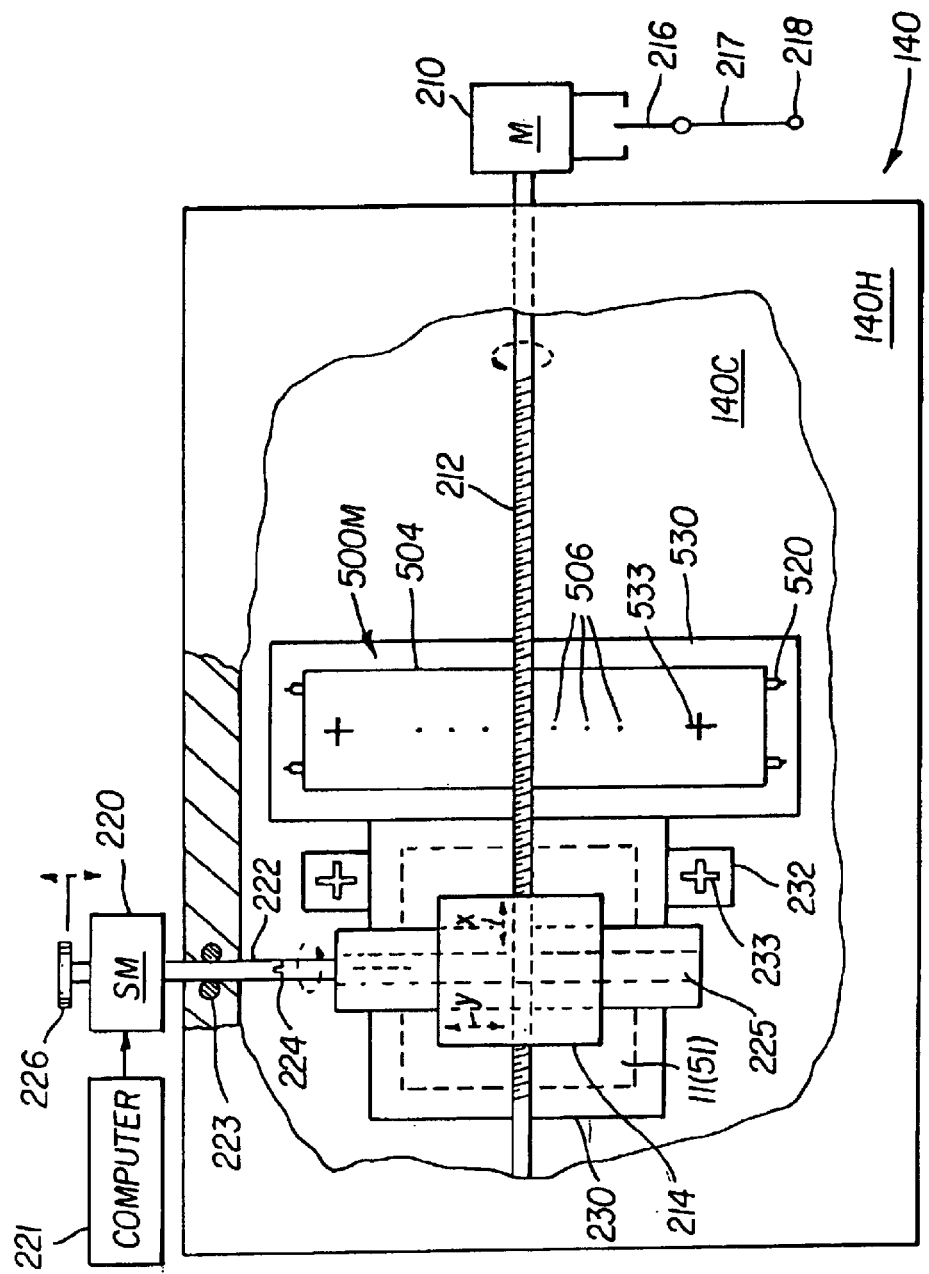
FIG. 17 is a schematic top view of a portion of the LEL vapor deposition station of FIG. 2, and showing alignment features on the nozzle plate and on the substrate holder, and an indexing feature of indexing the substrate in a y-direction prior to each substrate motion in an x-direction over and past the nozzles.

Upon aligning a substrate in the chamber 140C in a y-direction with respect to the nozzles 506 via the alignment marks 533 and alignment windows 233 provided on a holder or mask frame 230 in which a substrate is positioned (see FIGS. 16 and 17), the substrate 11 (51) is moved in an x-direction to a starting position "I" by a lead screw 212 (see FIGS. 16 and 17). It will be understood that either the substrate 11 (51) or the manifold 500M can be moved. Of course, deposition can also be accomplished if either of these elements is stationary.

A plurality of organic material vapor sources 500VS1 to 500VS4 is shown disposed outside of the chamber 140C. In order to coat a light-emitting layer at least one of the materials in vapor sources 500VS1 to 500VS4 would be a light-emitting material. Alternatively the said plurality or organic material vapor sources 500VS1 to 500VS4 could be disposed inside of the chamber 140C and/or inside of manifold 500M. Each vapor source includes a housing 540. As depicted schematically in FIG. 8 and described in greater detail with reference to FIG. 15, the housing 540 includes a flange 541 which sealingly mates with a source cover 544 and which, in turn, is sealingly attached to a lower vapor transport conduit 546a. A vapor flow control device 560v is connected at one termination to the lower vapor transport conduit 546a, and at a second termination to an upper vapor transport conduit 546b. Each vapor source 500VS1 to 500VS4 also preferably includes an individual heating element not shown in FIG. 8 for heating the material inside to an appropriate temperature to create a vapor of that organic material placed within the vapor source. Alternatively the said organic material can be loaded directly into manifold 500M without the use of separate said vapor sources 500VS1 to 500VS4, and organic vapor created through the use of a heating element (not pictured) placed directly on or in the manifold 500M.

An inert gas supply 500IGS has a gas shut-off valve 562 and a conduit (not identified in the drawing) leading from the gas shut-off valve into an inert gas preheater 564 for heating the gas to a temperature sufficient to prevent condensation of organic material vapors on inner surfaces of elements in which both the inert gas flow and flow of an organic material vapor are present. A lower gas transport conduit 566a connects the inert gas preheater to one termination of a gas flow control device 560g, and an upper gas transport conduit 566b connects a second termination of the gas flow control device 560g to a combiner 570. The combiner 570 also accepts the upper vapor transport conduits 546b, and combines inert gas flow and at least a portion of organic material vapor from two organic material vapor sources which are operative concurrently, as will be described further hereinafter. A common conduit 546c for vapor transport and gas transport connects an output termination of the combiner 570 to the manifold 500M through the housing 140H of the vapor deposition station 140. Alternatively, inert gas could be fed directly into the manifold 500M and mixed with organic vapor that has been transported or generated there.

The organic material vapor sources, the inert gas preheater, the flow control devices, the combiner, and the transport conduits are arranged within a heatable enclosure 600 shown in dashed outline. The heatable enclosure can be an appropriately sized and configured laboratory oven which can be controllably heated to provide a temperature $T_e$ within the enclosure sufficient to prevent condensation of organic material vapors on inside surfaces of the vapor sources, conduits, vapor flow control devices, and the combiner 570.

Likewise, to prevent condensation of organic material vapors on inner surfaces of the manifold 500M and the surface of the structure or nozzle plate 504 facing the manifold, and to prevent clogging of the nozzles 506 by vapor condensation, the manifold can be heated by manifold heating lamps 520. Not shown in FIG. 8 is a controllable heating lamp power supply and electrical connections to the heating lamps 520. It will be appreciated that, for example, heating coils or heating strips can be used equally effectively in heating the manifold and the nozzle plate.

It has been found unexpectedly that highly directed beams of gas with a very small angular divergence from the nozzle axis will exit from the nozzles 506 if gas flow is controlled by the gas flow control device 560g such that a resulting gas pressure in the manifold 500M causes viscous flow of the gas from the manifold through the nozzles and into the chamber 140C. It has also been found that organic material vapors can be combined with flowing inert gas in the combiner 570 to be transported into the manifold 500M, and to issue from the nozzles 506 as combined directed beams 510 of organic material vapors and inert gas. It has also been established for directed gas beams, that collimation can be retained over a distance in a range from about 0.02 to 2.0 centimeter above the structure or nozzle plate 504 depending on an inside dimensions of the nozzles and on a level of gas flow into the manifold with corresponding increase of gas pressure therein.

Alternatively it has also been found that that highly directed beams of gas with a very small angular divergence from the nozzle axis will exit from the nozzles 506 if gas flow is controlled by the gas flow control device 560g such that a resulting gas pressure in the manifold 500M causes viscous flow of the gas from the manifold through the nozzles and into the chamber 140C when the said organic material is vaporized directly in said manifold 500M.

Alternatively it has also been found that that highly directed beams of gas with a very small angular divergence from the nozzle axis will exit from the nozzles 506 if gas flow is controlled by the gas flow control device 560g such that a resulting gas pressure in the manifold 500M causes viscous flow of the gas from the manifold through the nozzles and into the chamber 140C when the said organic material is vaporized directly in said manifold 500M and is combined with an inert gas in manifold 500M.

In an effort to provide improved understanding of forming a directed beam of a gas flowing though a nozzle under conditions of viscous flow, pertinent sections of "Handbook of Thin Film Technology", edited by Leon I. Maissel and Reinhard Glang, published by McGraw Hill Book Company in 1970 and "Foundations of Vacuum Science and Technology edited by James M. Lafferty, published by John Wiley & Sons, Inc. are referenced.

If a gas is flowing through a narrow tube it encounters resistance at the walls of the tube. Thus, gas layers at and adjacent to the walls are slowed down, causing viscous flow. A viscosity coefficient $\eta$ results from internal friction caused by intermolecular collisions. This viscosity coefficient $\eta$ is given by $$\eta = \frac{2f}{\pi\sigma^2}\left(\frac{mk_BT}{\pi}\right)^{\frac{1}{2}} \quad (1)$$

where f is a factor between 0.3 and 0.5 depending on the assumed model of molecular interaction. For most gases, f=0.499 is a good assumption. $\sigma$ is the molecular diameter; m is the mass of a gas molecule; $\kappa_B$ is the Boltzmann constant; and T is the temperature of the gas, given in Kelvin (K).

Specifically, for a straight cylindrical tube of length l and a radius r having an inert gas flowing through it a viscous flow microscopic flow rate $Q_{visc}$ can be given by $$Q_{visc} = \frac{\pi r^4}{8\eta l}\bar{p}(p_2 - p_1) \quad (2)$$

wherein $\bar{p}$ is the average pressure in the tube, and $p_2$ and $p_1$ are the pressures at opposing ends of the tube.

The mean free path of a gas $\lambda$ is given by $$\lambda = \frac{k_BT}{\sqrt{2}\pi\sigma^2 P} = \frac{1}{\sqrt{2}\,\pi n\sigma^2} \quad (3)$$

where $\sigma$ is the molecular diameter, n is the number of molecules per unit volume and P is the gas pressure.

When gas flows through a tube of diameter d there are in general three flow regimes being free molecular flow, continuum or viscous flow and transitional flow that can be used to characterize the flow. Knudsen's number Kn given by $$Kn=\lambda/d \quad (4)$$

is used to characterize the flow regime. When Kn>0.5 the flow is in the free molecular flow regime. Here gas dynamics are dominated by molecular collisions with the wall of the tube or vessel. Gas molecules flow through the tube by successive collisions with the walls until experiencing a final collision, which ejects them through the opening. Depending on the length to diameter ratio of the tube the angular distribution of emitted molecules can range from a cosine theta distribution (for zero length) to a heavily beamed profile (for large length to diameter ratio) (see Lafferty for details). Even in the case of the heavily beamed profile, there is a significant component of the emitted flux at non zero angles to the axis of the tube. When 0.01<Kn<0.5 the flow is in the transitional flow regime in which both molecular collisions with the wall and intermolecular collisions influence flow characteristics of the gas. As Kn gets lower we approach the viscous flow regime and the flow is dominated by intermolecular collisions. When Kn<0.01 the flow is in the viscous flow regime. Here the mean free path of the gas is small compared to the diameter of the tube and intermolecular collisions are much more frequent than wall collisions. When operating in the viscous flow regime gas coming out of the tube orifice usually flows smoothly in streamlines generally parallel to the walls of the orifice and can be highly directed in the case of large length to diameter ratios.

For certain vaporizable materials, the vapor pressure at useful temperatures is low enough that it is difficult to attain viscous flow for small openings, such as would be useful in producing pixilated OLED displays. In such cases, an additional gas (for example an inert gas acting solely as a carrier) may be used to produce the viscous flow.

The vapor pressure p* of a gas can be approximated from the relationship $$\text{Log } p^*=A/T+B+C \text{ Log } T \quad (5)$$

where A, B, and C are constants. The vapor pressure of Alq has been measured to vary from 0.024–0.573 Torr from 250–350° C. The best fit coefficients were found to be A=−2245.996, B=−21.714 and C=8.973. The mean free path for Alq varies from 0.5–0.0254 mm at the vapor pressure over the temperature range 250–350° C. Thus the vapor pressure of Alq alone is insufficient to produce viscous flow in a circular nozzle structure with a 100 µm tube diameter over the temperature range 250–350° C. A vapor pressure of approximately 15 Torr will be required to get into the viscous flow regime for Alq and this tube diameter.

The vapor flow control devices 560v and the gas flow control device 560g can be manually adjustable flow control valves. Alternatively, these flow control devices can be mass-flow control devices which can be adjusted in a graduated manner from a closed position to an open position in response to electrical control signals provided by controllers which, in turn, can be addressed by signals from a computer (not shown).

One of the organic material vapor sources, for example the vapor source 500VS4, is charged with a vaporizable organic host material. This organic host material can be in the form of a powder, flakes, particulates or liquid. If a full-color (RGB) OLED display is to be formed, each of the remaining organic material vapor sources, for example the vapor sources 500VS1, 500VS2, and 500VS3, is charged with a different vaporizable organic dopant material. For example, the vapor source 500VS1 is charged with a dopant material, which provides green light emission from a pixelated doped layer 14G of the organic host material. The vapor source 500VS2 can be charged with a dopant material, which provides red light emission from a pixelated doped layer 14R of the organic host material. The vapor source 500VS3 receives a dopant material, which provides blue light emission from a pixelated doped layer 14B of the organic host material. The organic dopant materials can be in the form of a powder, flakes, particulates or liquid.

Using the above described examples of the vapor sources and the respective charges of organic materials, the vapor deposition apparatus 500 can be operated as follows to provide full-color pixelation on a substrate 11 or on a substrate 51, depicted here as a stripe pattern of a light-emitting layer 14R (or 14G, or 14B). The vapor source 500VS2 (red dopant) and the vapor source VS4 (host material) are heated to vaporization temperatures which causes the respective organic materials to vaporize, usually by sublimation. The corresponding vapor flow control devices 560v are actuated so that a controlled dopant vapor flow and a controlled host vapor flow passes from these two vapor sources via lower and upper vapor transport conduits (546a and 546b, respectively), the combiner 570, and the common conduit 546c, into the manifold 500M in which complete "molecular mixing" of the host material vapor and the dopant material vapor are achieved. These vapors of the organic materials create a vapor pressure $P_v$ within the manifold which can be approximately 0.024–0.573 Torr over the sublimation range from 250–350° C. for Alq, as described in more detail in conjunction with FIG. 14.

Flow of an inert gas, for example nitrogen or argon gas, is initiated by controlling an opening in the gas flow control device 560g upon opening the gas shut-off valve 562 which is included in the inert gas supply 500IGS. The flowing inert gas is preheated in the inert gas preheater 564, and preheated gas passes into the manifold 500M via lower and upper gas transport conduits (566a and 566b, respectively), the combiner 570, and through the common conduit 546c for vapor transport and gas transport. The inert gas provides a gas pressure $P_G$ in the manifold which is adjusted (via gas flow control device 500g) to be sufficient to cause viscous flow of the gas through the nozzles 506 in the structure or nozzle plate 504, and to provide substantially directed beams of inert gas which transport with them the mixed vapors of the organic materials introduced into the manifold to achieve the directed beams 510 of organic material vapors and inert gas.

The OLED display substrate 11 (51) had been previously oriented with respect to the nozzles 506 by aligning it in a y-direction via the alignment marks 533 on the nozzle plate and corresponding alignment windows 233 disposed on a holder or mask frame 230 for holding the substrate (not shown in FIG. 8, see FIGS. 16, 17). The substrate is moved in an x-direction over and past the directed beams 510 to receive in designated subpixels in a stripe pattern an organic red light-emitting layer 14R. The stripe pattern is provided by moving or translating the substrate in a forward motion "F" from a starting position "I" to an end position "II" of forward motion. Alternatively, it is possible to fix the substrate position and translate the manifold in reference to that substrate.

Vapor flow from the vapor sources 500VS4 (host material) and 500VS2 (red dopant) is now discontinued by closing the corresponding vapor flow control devices 560v, and by discontinuing heating of the vapor source 500VS2. The flow of preheated gas into the manifold and through the nozzles can continue, or it can be discontinued by closing the gas flow control device 560g. Additionally, a shutter device (see FIG. 16) can be positioned over the nozzle plate to block residual vapor streams or residual directed beams from reaching the substrate during a reverse or return motion "R" from the position "II" to the position "I".

The substrate 11 (51) is now moved or translated from the position "II" by a reverse or return motion "R" back to the starting position "I". The vapor source 500VS1 (green dopant) is heated to cause sublimation of this dopant and introduction of "green" dopant vapors into the manifold at a vapor flow controlled by the vapor flow control device 560v associated with the vapor source 500VS1. The steps of providing vapor of the host material from source 500VS4 into the manifold, and to create directed beams 510 by flowing the preheated inert gas into the manifold 500M to cause viscous flow in the nozzles 506, are repeated. In position "I", the substrate is reoriented or indexed with respect to the nozzles so that subpixels designated to receive an organic green light-emitting layer 14G are aligned with the nozzles. The substrate is then moved or translated in a forward direction "F" over and past the directed beams issuing from the nozzles 506 to the position "II" to receive in a stripe pattern in the designated subpixels an organic green light-emitting layer 14G.

The above described process steps are repeated by forming a stripe pattern of an organic blue light-emitting layer 14B in designated subpixel locations of the substrate 11 (51) via the vapor sources 500VS3 (blue dopant) and 500VS4 (host material). Thus, if desired, a full-color RGB color pixelated OLED display 10-3C or 50-3C can be achieved by the method of the invention in a vapor deposition apparatus 500.

It will be appreciated that a multicolor OLED display can be made equally effectively by the inventive method. A structure or nozzle plate 504 having nozzles 506 arranged to correspond to selected columns (or rows) of subpixels is used for that purpose.

FIG. 8 and its description include four vapor sources 500VS1 to 500VS4. It will be understood that more or fewer vapor sources can be used in practicing color pixelation by the inventive method. Also, the selection of vaporizable organic materials charged into vapor sources can be different from the materials described with reference to FIG. 8. For example, a first vapor source can be charged with a first vaporizable organic host material, and a second vapor source can receive a second vaporizable organic host material. A third vapor source, or a third and additional vapor sources, can be charged with vaporizable organic dopant materials which are selected to cause emission of one of red, green, or blue light from a pattern of a doped organic light-emitting layer of an operative OLED display.

Using two organic host materials and one or more organic dopant materials in forming the doped organic light-emitting layer can provide improved operational stability, or improved light emission, or improved color of emitted light, or combinations of such improved features, of an operative OLED display.

One or more vaporizable organic dopant materials can be charged into one vapor source.

Upon completion of color pixelation, all vapor sources are deactuated by discontinuing the heating of the sources, and the inert gas flow is discontinued by closing the gas shut-off valve 562 or by controlling the closing of the gas flow control device 560g. The completed substrate is moved or translated in an x-direction from the position "II" back to the position "I". The substrate 11 (51) can be removed from the chamber 140C in this latter position via the station valve 141 shown in FIG. 2 once the inert gas flow into the chamber has been discontinued and the chamber 140C has been evacuated (by station vacuum pump 142 via throttle valve 145) to a pressure which is approximately equal to the pressure prevailing in the buffer hub 102 of FIG. 2. The color pixelated substrate can then be advanced into the station 150 (ETL) for vapor deposition of an organic electron-transporting layer, which can include an electron-injecting sublayer.

Figure 9:
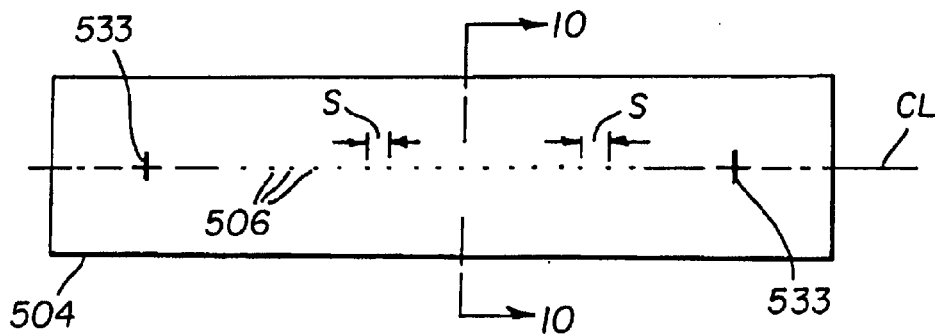
FIG. 9 shows a structure or nozzle plate having nozzles arranged along a center line.

Turning to FIG. 9, a structure or nozzle plate 504 is shown having a plurality of nozzles 506 arranged along a center line CL. The nozzle pitch, which is the equal spacing s between nozzles, is selected to produce the necessary deposition pattern that accurately coats the desired subpixels of an OLED display. The total number of nozzles 506 corresponds to a total number of subpixels of an OLED display which are designated to emit light of a selected color such as, for example red light, green light, or blue light. Alignment marks 533 are shown here in the form of alignment crosses, but other alignment methods can be utilized.

Figure 10:
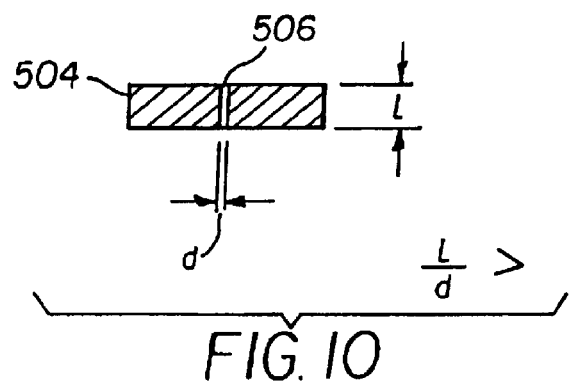
FIG. 10 is a sectional view of the nozzle plate, taken along lines 10—10 of FIG. 9, and defining a nozzle length dimension and a nozzle inside dimension.

FIG. 10 is a sectional view of the nozzle plate 504, taken along the section lines 10—10 of FIG. 9. A nozzle inside dimension or a nozzle diameter d and a nozzle length dimension l are indicated. Nozzles 506 can be of a circular outline or of a polygonal outline. Nozzle inside dimensions d can be in a range from 10 to 1000 micrometer, and directed beams 510 (see FIG. 8) of organic material vapors and inert gas can be achieved providing that the nozzle length dimension l is at least 5 times larger than the nozzle inside dimension d.

Figure 11:
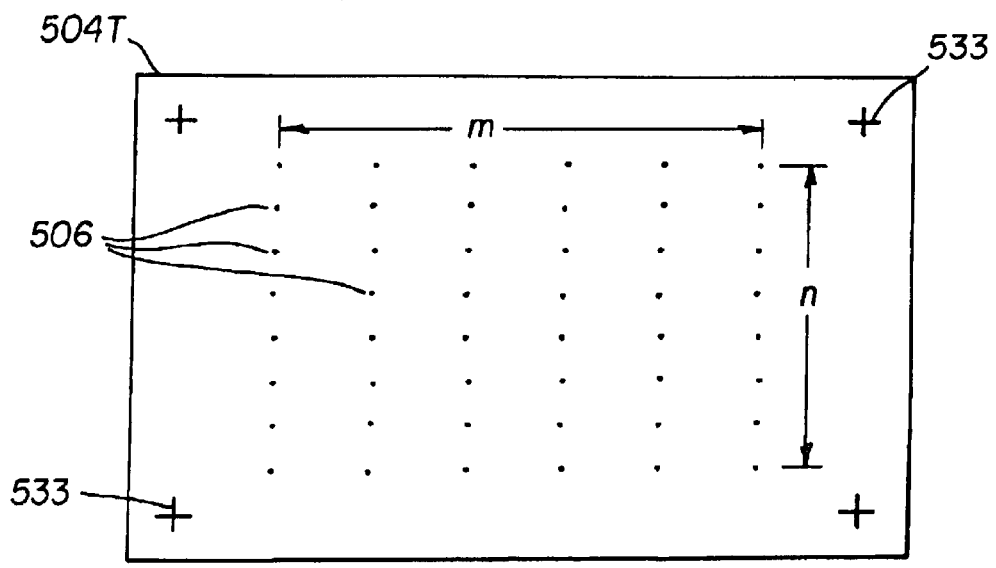
FIG. 11 shows a nozzle plate having a two-dimensional array of nozzles arranged in rows and columns.

Turning to FIG. 11, a structure or nozzle plate 504T is shown which includes a two-dimensional array of nozzles 506 as well as alignment marks 533. The nozzle array 504T is depicted with m columns of nozzles and having n rows of nozzles. Such nozzle plate 504T can be sealingly positioned on one side of an appropriately sized manifold, and a shutter device can be positioned between the nozzle array 504T and an OLED display substrate which is to receive color pixelation so that the shutter device blocks direct line-of-sight between the nozzles 506 and the substrate. The substrate is oriented with respect to the nozzles via the alignment marks 533 and corresponding alignment windows 233 (see FIGS. 16, 17) formed on a holder or mask frame 230 which accepts and transports the substrate. The substrate is moved to be positioned over the nozzle plate 504T and in alignment therewith. The shutter device is then withdrawn, and directed beams of inert gas and vapors of an organic host material and of a color-forming dopant material are forming a doped organic light-emitting layer (such as a layer 14R, or 14G, or 14B) on discrete and selected subpixels of the substrate, as distinguished over the continuous motion or translation of a substrate over and past directed beams to produce a stripe pattern of color pixelation.

Figure 12:
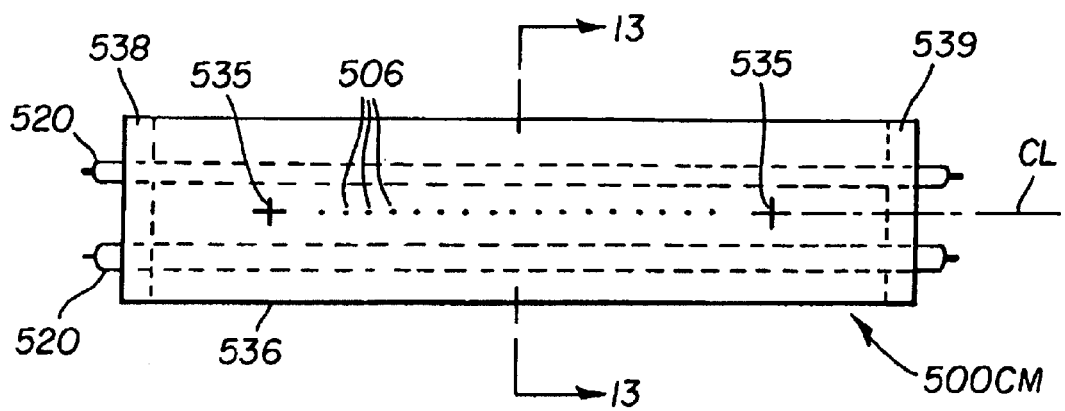
FIG. 12 is a schematic top view of a cylindrical tubular manifold having nozzles arranged along a center line.

Turning to FIG. 12, a schematic top view of a cylindrical tubular manifold 500CM is shown. The manifold 500CM has a cylindrical manifold housing 536, which includes end caps 538 and 539. Manifold heating elements 520 extend throughout the manifold and are supported by the end caps. A plurality of nozzles 506 is formed directly in the housing 536 as a line pattern along a center line CL. Alignment marks 535 are provided along the cylindrical surface and positioned along the center line CL.

Figure 13:
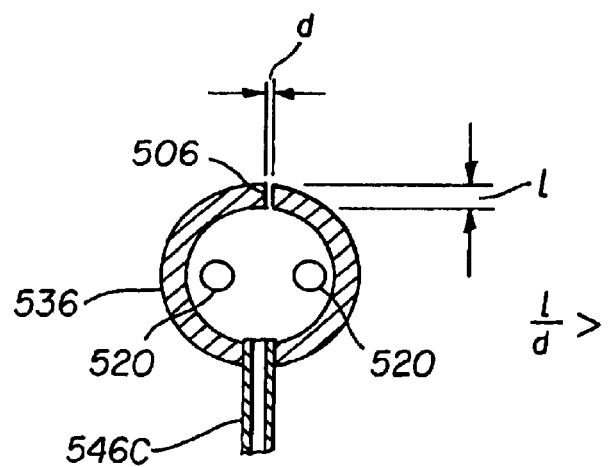
FIG. 13 is a sectional view of the cylindrical tubular manifold, taken along section lines 13—13 of FIG. 12, and defining a nozzle length dimension and a nozzle inside dimension.

FIG. 13 is a sectional view of the cylindrical manifold, taken along the section lines 13—13 of FIG. 12, and defining a nozzle length dimension l and a nozzle inside dimension d. The nozzle inside dimension d can be in a range from 10 to 1000 micrometer, and the nozzle length should be at least 5 times larger than the nozzle diameter. Other configurations of tubular manifolds can be used such as, for example, tubular manifolds having an ellipsoidal cross-section or a polygonal cross-section.

Figure 13A:
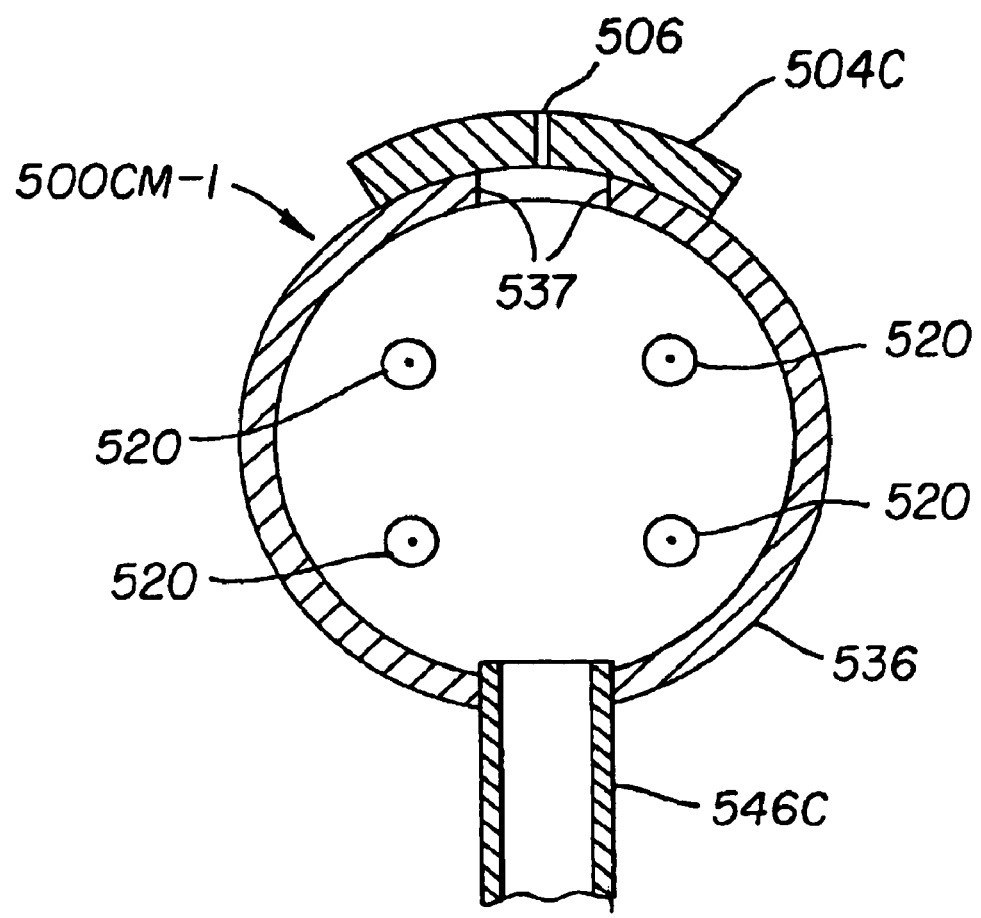
FIG. 13A is a sectional view of a modified cylindrical tubular manifold having a curved nozzle plate disposed over a slit-shaped aperture formed in a cylindrical manifold housing.

FIG. 13A shows a sectional view of a modified cylindrical tubular manifold 500CM-1 in which a curved structure or curved nozzle plate 504C is sealingly disposed over a slit-shaped aperture 537 formed in the cylindrical manifold housing 536. Nozzles 506 are formed in the curved nozzle plate 504C along a line such as shown for the line of nozzles in FIG. 12. Alignment marks 535 are provided on the curved nozzle plate (not shown in FIG. 13A).

Figure 14:
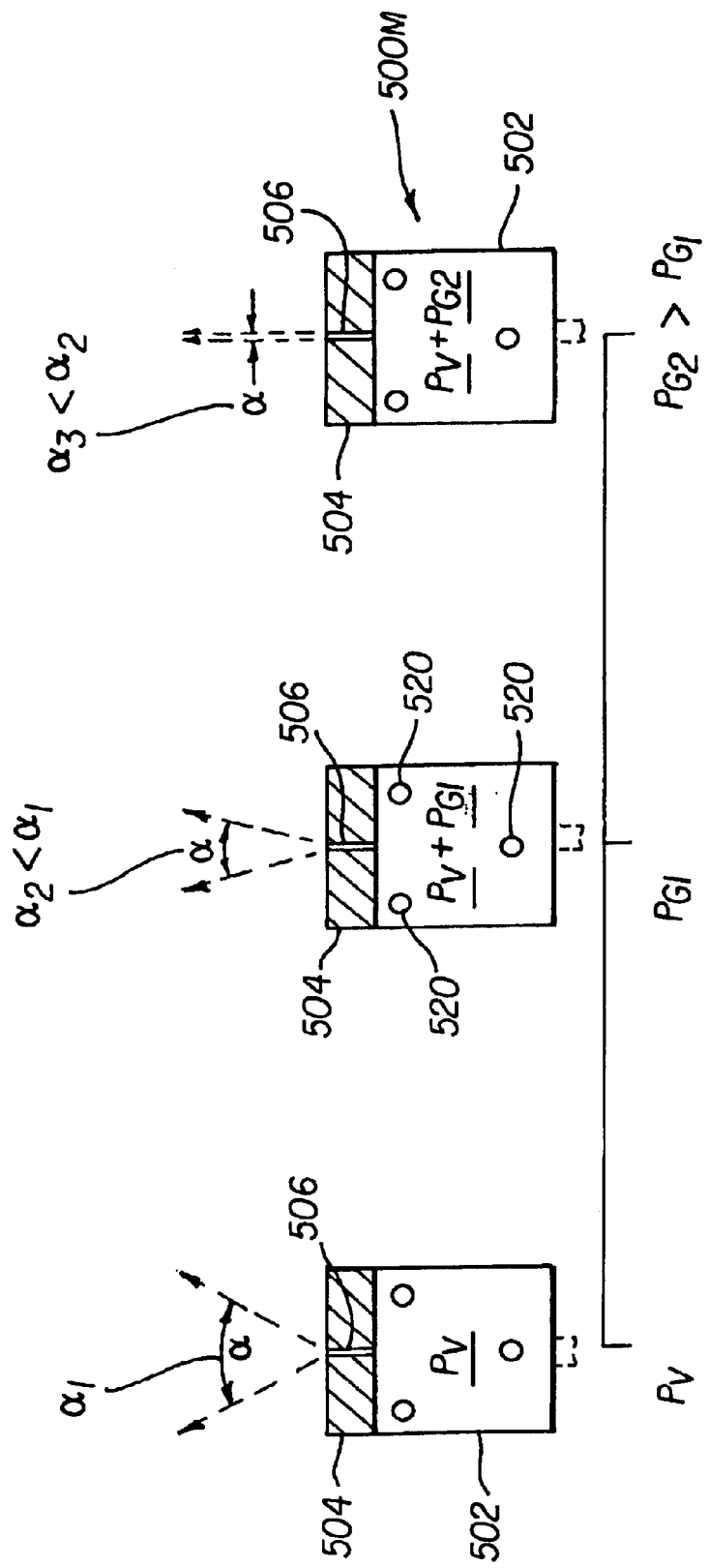
FIG. 14 indicates schematically a relationship between divergence of an organic material vapor stream issuing from a nozzle over a manifold and, respectively, a vapor pressure in the manifold and the vapor pressure plus inert gas pressure levels in the manifold.

Turning to FIG. 14, a relationship is indicated schematically between divergence of an organic material vapor stream issuing from a nozzle 506 and, respectively, a vapor pressure $P_v$ within the manifold housing 502 and the vapor pressure $P_v$ plus inert gas pressure levels $P_{G1}$ and $P_{G2}$ in the manifold 500M. The divergence is indicated by dashed arrows and angles $\alpha_1$, $\alpha_2$, and $\alpha_3$ subtending the streams issuing from the nozzle 506 formed in the nozzle plate 504. The reduced pressure $P_c$ in the chamber 140C, which can include a pressure of an inert gas admitted into the chamber (see FIG. 2), can be in a range from $10^{-7}$ to $10^0$ Torr.

When, in the absence of inert gas flow into the manifold 500M, vapors of organic host materials and of a dopant are introduced into the manifold from respective vapor sources, a vapor pressure $P_v$ of approximately 0.1 Torr (13 Pa) is formed in the manifold at a sublimation temperature of about 300° C. in the organic material vapor sources. Such organic material vapors at this vapor pressure provide a non-viscous flow through the nozzle 506 and enter the chamber with relatively high divergence as shown by the subtended angle $\alpha_1$. When inert gas flow is additionally introduced into the manifold so as to cause a gas pressure $P_{G1}$, the divergence of the vapor stream plus the inert gas stream issuing from the nozzle is reduced as depicted by the subtended angle $\alpha_2$, indicating that the introduction of the inert gas has caused some level of viscous flow behavior. When inert gas flow into the manifold 500M is further increased to cause a gas pressure $P_{G2} > P_{G1}$ in the manifold, the divergence of the vapor stream and of the inert gas stream issuing from the nozzle 506 is further reduced to provide a substantially directed beam having a subtended angle $\alpha_3$, indicating a substantial contribution to viscous flow through the nozzle 506 by the inert gas at the latter gas pressure level in the manifold 500M.

Figure 15:
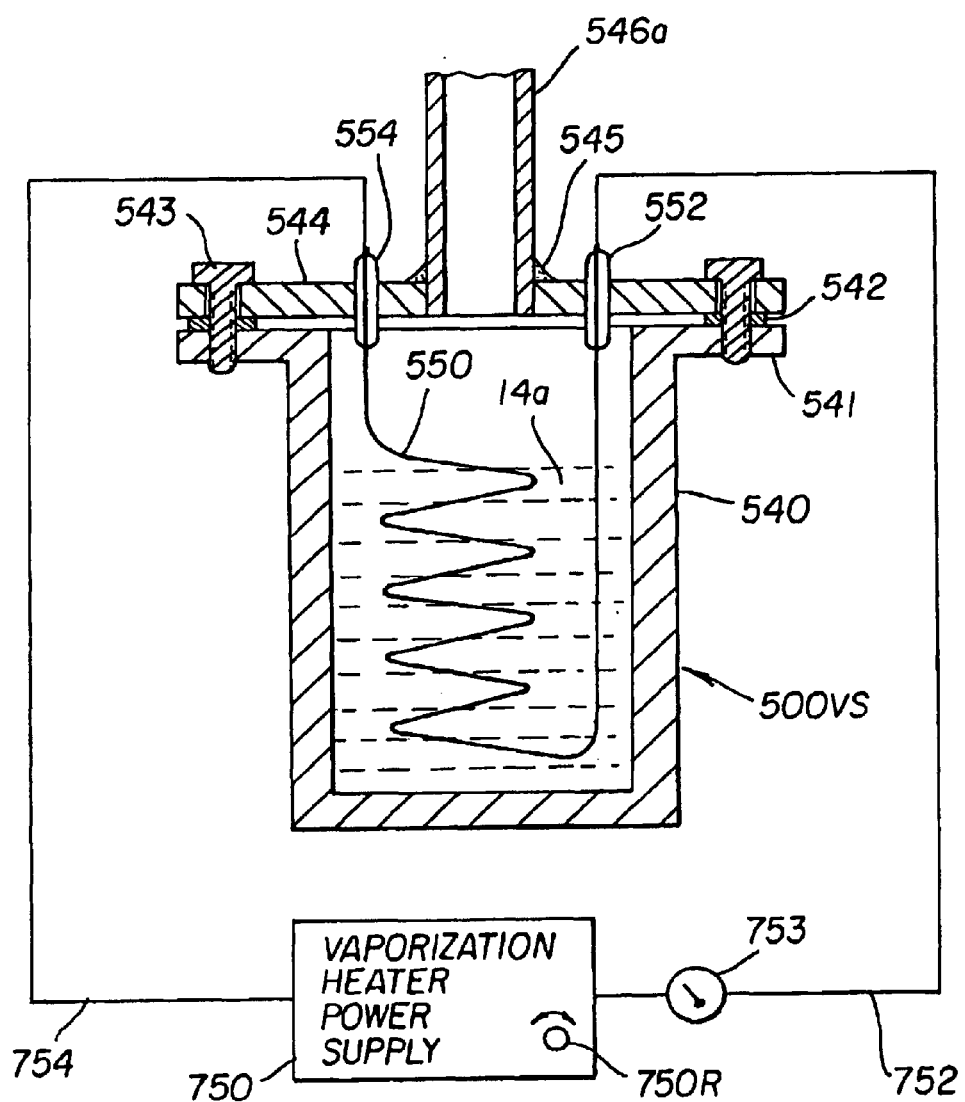
FIG. 15 is a sectional view of an embodiment of a vapor source such as the vapor sources shown schematically in FIG. 8.

Turning to FIG. 15, a sectional view of an embodiment of a vapor source 500VS is shown which is representative of the vapor sources 500VS1–500VS4 depicted schematically in FIG. 8. The vapor source 500VS includes a housing 540 having a flange 541. A gasket 542 provides a sealing engagement between the flange 541 and a source cover 544 via bolts 543 which are provided around the periphery of the flange and of the source cover. The gasket 542 can be an annular compression gasket made of a metal such as aluminum or copper, as is well known to those skilled in the art of vacuum technology.

A vaporization heater 550 extends within the housing 540, supported by feedthroughs 552 and 554, which are provided in the source cover 544. The vaporization heater 550 can be heated to a vaporization temperature which causes a vaporizable organic material 14a (shown in dashed outline) received in the vapor source 500VS to sublime and to provide vapors (not shown) into the lower vapor transport conduit 546a (see also FIG. 8). This conduit is sealed against the source cover 544 by a seal 545.

A vaporization heater power supply 750 is connected via a lead 752 to the feedthrough 552 and via a lead 754 to the feedthrough 554. Controlled heating of the vaporization heater 550 is achieved by controlling or regulating electrical current flow through the heater 550 with a regulator 750R. Current flow is indicated by a current meter 753.

The housing 540 of the vapor source 500VS can be detached from the source cover 544 by removing the bolts 543. Detaching the housing permits cleaning of residue of organic material 14a, and allows for charging a fresh supply of organic material 14a.

This embodiment of a detachable vapor source and other embodiments of detachable vapor sources useful in the practice of the present invention have been disclosed in a commonly assigned U.S. patent application Ser. No. 10/131, 926, filed on Apr. 25, 2002, and entitled "Thermal Physical Vapor Deposition Apparatus With Detachable Vapor Source(s)", by Steven A. Van Slyke, the disclosure of which is herein incorporated by reference.

Turning to FIG. 16, a schematic sectional view of the vapor deposition station 140 (LEL) of FIG. 2 is shown, taken along the section lines 16—16 of FIG. 2. The vapor sources 500VS and the inert gas preheater 564 have been omitted in this drawing. The common conduit 546c extends into the manifold 500M through a thermally insulative manifold support 530 which is sealed with respect to the housing 140H by a gasket 532. A shutter 238 can be moved into a position of covering the nozzles 506, shown in dashed outline, or into a position in which directed beams 510 (not shown) can provide color pixelation of an OLED display substrate 11 (51).

An OLED display substrate 11 (51) is positioned in a holder or mask frame 230 and has a spacing D from an upper surface of the nozzle plate 504 and thus from the nozzles 506. A glide shoe 225 is fixedly attached to an upper surface of the holder 230, and is depicted here as a dovetail glide shoe. The glide shoe 225 glides matingly in a glide rail 225R, which is formed in a lead screw follower 214.

The glide shoe and the glide rail permit motion of the holder 230 and of a substrate 11 (51) retained therein in a y-direction (see FIG. 17) to provide alignment of the substrate with respect to the nozzles, and to index a substrate prior to each one of the color pixelating steps described with reference to FIG. 8.

A lead screw 212 engages the lead screw follower 214 and moves it (and the holder 230) in an x-direction of a forward motion "F" from a starting position "I" to an end position "II" (shown in dashed and dotted outline). During this continuous motion, the substrate 11 (51) passes over and past directed beams (not shown) of organic material vapors and of the inert gas to provide in a stripe pattern a pixelated organic layer.

The lead screw 212 is formed on portions of a lead screw shaft 211 which is supported in at least two locations, namely in a shaft seal 211a formed in the housing 140H of the station 140, and in a lead screw shaft termination bracket 213 which is mounted onto the housing 140H.

A lead screw drive motor 210 provides for forward motion "F" or for reverse or return motion "R" via switch 216 which provides a control signal to the motor from an input terminal 218 via a lead 217. The switch 216 can have an intermediate or "neutral" position (not shown in FIG. 16; see FIG. 17) in which the holder or mask frame 230 (and the substrate) can remain either in the end position "II" of forward motion, or in the starting position "I" in which a substrate 11 (51), having received color pixelation during a previous pass over the nozzles, is removed from the holder 230 and a new substrate is received in the holder or mask frame.

An alignment detector 234 serves to align the substrate 11 (51) with respect to the nozzles 506 in the nozzle plate 504 via alignment marks 533 (or via alignment marks 535 if a cylindrical manifold 500CM is used) which are aligned with alignment windows 233 formed in alignment tabs 232 that can be attached to the holder or mask frame 230. The alignment detector detects alignment via an optical window 235 provided in the housing 140H, and along an optical alignment axis 236. It is sufficient to provide optical alignment at either one of the alignment marks 533.

Turning to FIG. 17, a schematic top view of a portion of the LEL vapor deposition station 140 of FIG. 2 is shown. The manifold 500M is positioned on the thermally insulative manifold support 530. Alignment tabs 232 are shown attached to the holder or mask frame 230, and alignment windows 233 are formed in these tabs in the form of a cross to correspond with the cross-shaped alignment marks 533 provided on the nozzle plate 504 or to the cross-shaped alignment marks 535 on the cylindrical manifold 500CM of FIG. 12.

A stepper motor 220 has a drive shaft 222 which extends through the stepper motor and enters the chamber 140C through a shaft seal 223 formed in the housing 140H. A shaft coupling 224 can be disengaged prior to motion or translation of the holder 230 in the x-direction via the lead screw 212 which engages the lead screw follower 214. The shaft coupling 224 is disengaged by lifting the coupling lifter 226 which is attached to the portion of the drive shaft extending through the stepper motor 220. The stepper motor 220 provides precise indexing of the substrate 11 (51) in a y-direction under control of a computer 221 by providing incremental rotation of the drive shaft 222 to advance or to retreat the holder 230 via the gliding mechanism provided by the glide rail 225R (see FIG. 16) and the glide shoe 225 when the shaft coupling 224 is in the engaged position, as indicated in FIG. 17.

Figure 18:
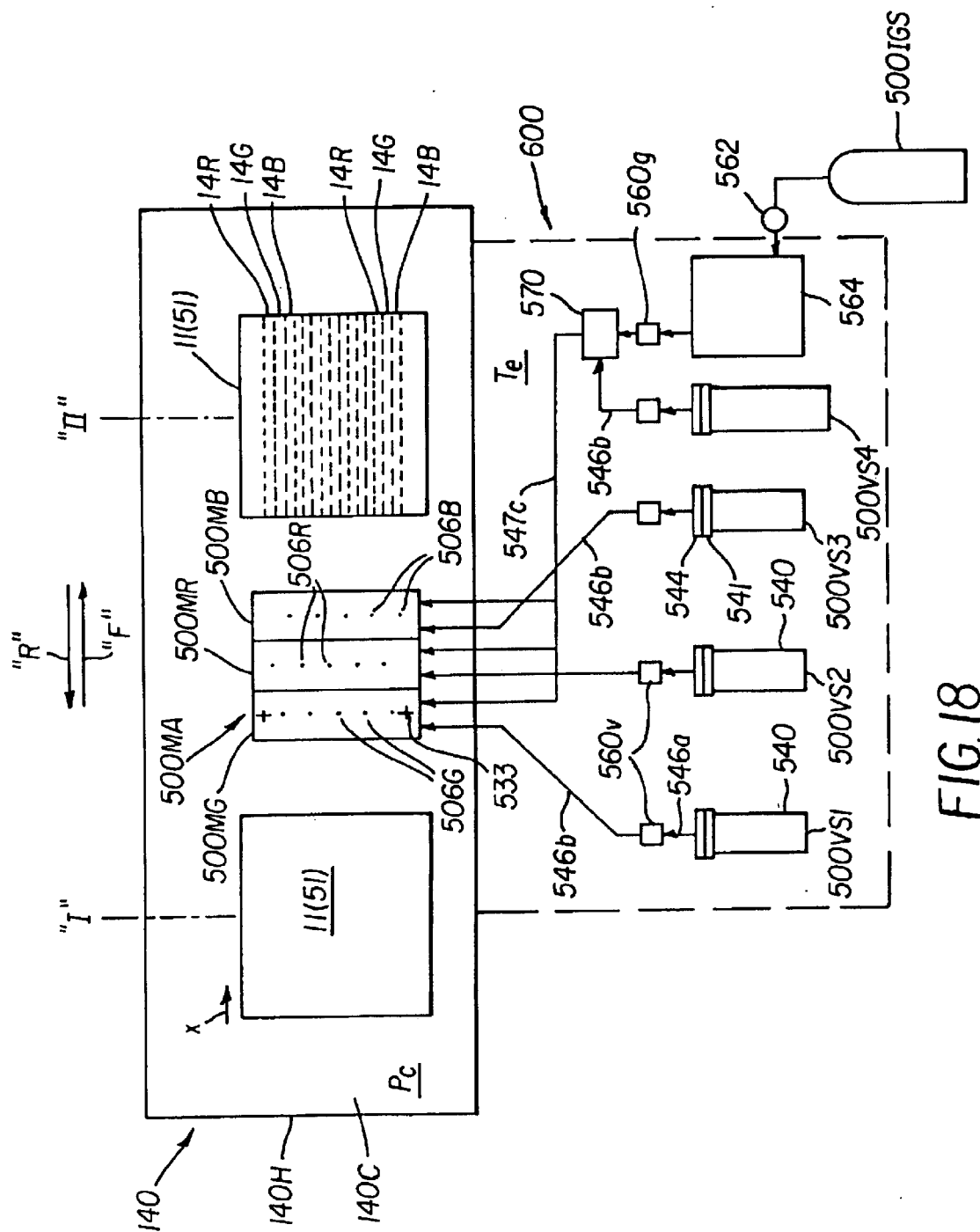
FIG. 18 shows schematically a manifold assembly, which is useful for concurrent color pixelation of an RGB full-color organic light-emitting layer in a single pass of a substrate over and past the nozzles in the assembly.

Turning to FIG. 18, a manifold assembly 500MA is shown schematically positioned in the chamber 140C. This manifold assembly is particularly useful in concurrently depositing in a three-color pattern organic layers onto an OLED display substrate. The manifold assembly 500MA includes three mechanically connected manifolds 500MB (for providing vapors of an organic host material and of a blue light-emitting dopant), 500MG (for providing vapors of the organic host material and of a green light-emitting dopant), and 500MR (for providing vapors of the organic host material and of a red light-emitting dopant). Corresponding nozzles 506B, 506G, and 506R, respectively, are offset among the three manifolds of the assembly 500MA in correspondence to the spacing needed to accurately coat the desired individual subpixels on an OLED display substrate 11 (51). Only one of the manifolds is provided with one or two alignment marks 533. It is noted that other alignment methods can also be utilized.

Each of the manifolds 500MB, 500MG, and 500MR receives a vapor of an organic host material from, for example, the vapor source 500VS4 via a vapor flow control device and via a common conduit 547c for vapor transport from the host material vapor source and for transport of inert gas. The combiner 570 combines the organic host material vapor and the preheated inert gas and delivers such combination into the common conduit 547c.

The manifold 500MB also receives a "blue" dopant vapor provided in this drawing by the vapor source 500VS3. The manifold 500MG also receives a "green" dopant layer which is provided here by the vapor source 500VS1, and the manifold 500MR also receives a "red" dopant vapor provided by the vapor source 500VS2.

As described above, the substrate 11 (51) is first oriented or aligned with respect to, for example, the alignment marks 533 associated with manifold 500MG. The substrate is then moved or translated along the x-direction to the starting position "I". Directed beams are next provided through the nozzles 506B, 506G, and 506R. The substrate is then moved or translated over and past the directed beams to the end position "II" to receive concurrently a pattern of color pixelation in the form of repeating red, green, and blue stripes of light-emitting layers 14R, 14G, and 14B, respectively, and in correspondence with designated sub-pixel columns to be formed on the OLED display substrate 11 (51). It is understood that while a simple row/column pixelation structure is shown, the described invention can be coupled with shuttering, other manifold geometries or other relative motion patterns to produce more complicated multicolor pixel deposition patterns.

Preferred materials for constructing the structure or nozzle plate(s) 504, 504C, and 504T include metals, glass, quartz, graphite and ceramics. The manifold housing 502, 536 can also be constructed from one of the above preferred materials. The material for constructing the manifold housing need not be the same materials for constructing a nozzle plate. For example, a manifold housing can be made of a metal, and nozzle plate can be made of glass.

It is understood that while PVD only has been discussed in this disclosure, the invention may also be used such that precursor species are fed into the manifold, reacted to form new molecular products, and these new products issued in the described manner from the nozzle array and deposited on suitable substrates.

Other Features of an OLED Display

Substrate

The OLED display is typically provided over a supporting substrate where either cathodes or anodes of the OLED display can be in contact with the substrate. The electrodes in contact with the substrate are conveniently referred to as bottom electrodes. Conventionally, bottom electrodes are the anodes, but this invention is not limited to that configuration. The substrate can either be light-transmissive or opaque, depending on the intended direction of light emission. The light-transmissive property is desirable for viewing the light emission through the substrate. Transparent glass or plastic is commonly employed in such cases. For applications where the light emission is viewed through the top electrode(s), the transmissive characteristic of the bottom support is immaterial, and therefore can be light-transmissive, light-absorbing or light-reflective. Substrates for use in this case include, but are not limited to, glass, plastic, semiconductor materials, silicon, ceramics, and circuit board materials. Of course it is necessary to provide in these device configurations a light-transmissive top electrode or top electrodes.

Anodes

When light emission is viewed through anodes 12 or anode pads 52, such electrodes should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used as anodes 12 (52). For applications where light emission is viewed only through the cathode electrode or electrodes, the transmissive characteristics of anodes are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer be provided between anodes and a hole-transporting layer 13 (53). The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 13 (53) of the organic EL display contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A)

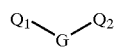

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B)

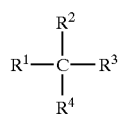

B where:

$R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C)

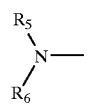

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D)

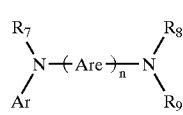

D wherein:

each Are may be an independently selected arylene group, such as a phenylene or anthracene moiety;

n is an integer of from 1 to 4; and

Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkenyl, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one can employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 14 (14R, 14G, 14B) and 54R, 54G, 54B of the organic EL display includes a luminescent or fluorescent material where electroluminescence is produced as a result of electron-hole pair recombination in this region. The light-emitting layer can be comprised of a single material, but more commonly consists of at least one host material doped with a guest compound or compounds (a dopant or dopants) where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated at 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting dopant molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red

E

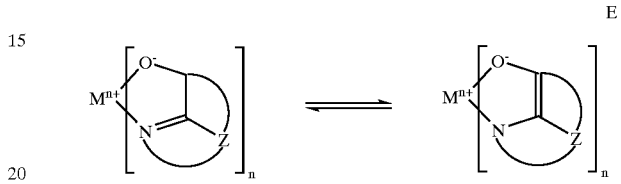

wherein:

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-□-oxo-bis(2-methyl-8-quinolinolato)aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

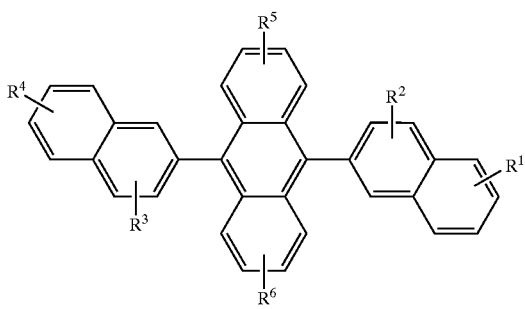

wherein R¹, R², R³, R⁴, R⁵, and R⁶ represent one or more substituents on each ring where each substituent may be individually selected from the following groups:
Group 1: hydrogen, alkenyl, alkyl, or cycloalkyl of from 1 to 24 carbon atoms;
Group 2: aryl or substituted aryl of from 5 to 20 carbon atoms;
Group 3: carbon atoms from 4 to 24 necessary to complete a fused aromatic ring such as anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful hosts capable of supporting electroluminescence, and are particularly suitable for light emission of wavelengths longer than 400 nm, e.g., blue, green, yellow, orange or red.

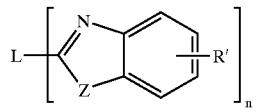

where:
n is an integer of 3 to 8;
Z is O, NR or S;
R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and there may be up to 4 R' groups per benzazole unit; and
L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Distyrylarylene derivatives as described in U.S. Pat. No. 5,121,029 are also useful host material for the LEL.

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives, and compounds. Illustrative examples of useful dopants include, but are limited to, the following:

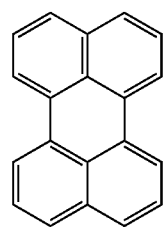

L1

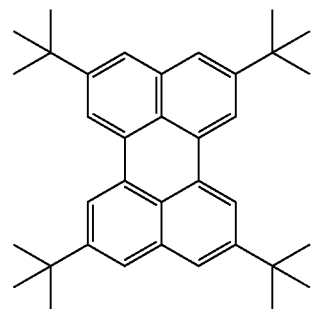

L2

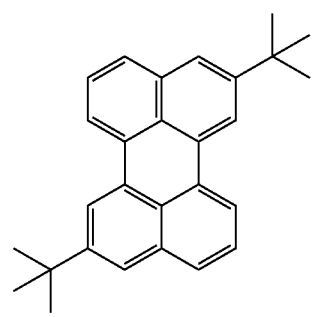

L3

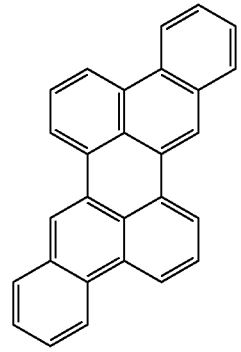

L4

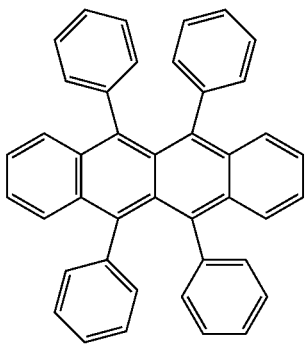

L5

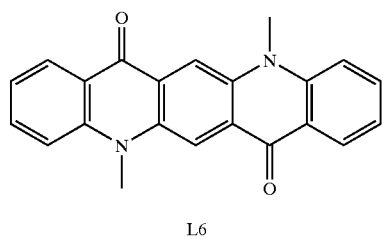

L6

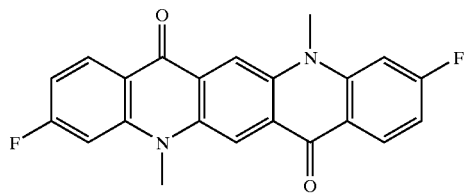

L7

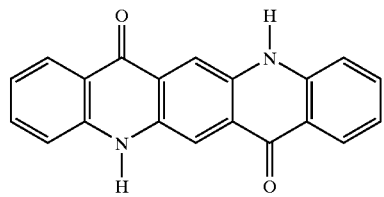

L8

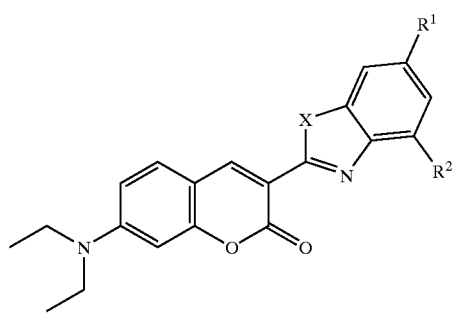

|  | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

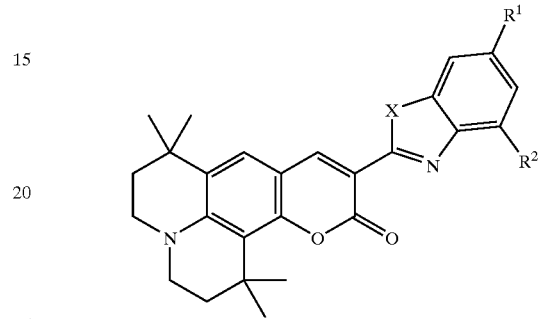

|  | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

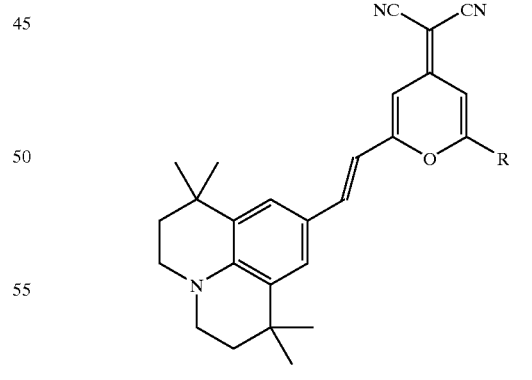

|  | R |
|---|---|
| L37 | phenyl |
| L38 | methyl |
| L39 | t-butyl |
| L40 | mesityl |

-continued

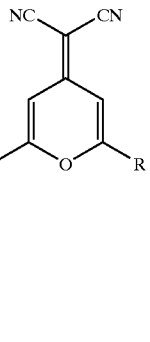

| | R |
|---|---|
| L41 | phenyl |
| L42 | methyl |
| L43 | t-butyl |
| L44 | mesityl |

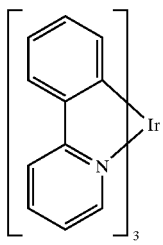

L45

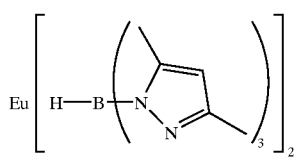

L46

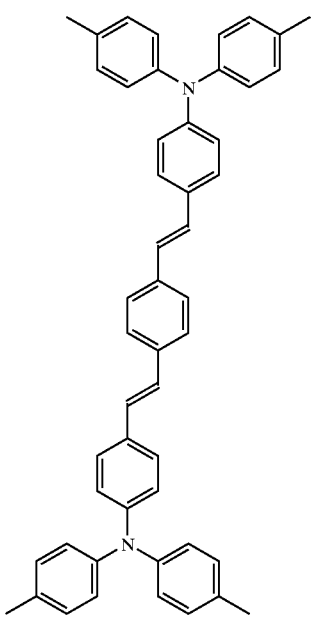

-continued

L47

L48

Electron-Transporting Layer (ETL)

Preferred thin film-forming material for in forming the electron-transporting layer 15 (55) of the organic EL display are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron-transporting materials.

Cathode(s)

When light emission is viewed solely through the anode(s), the common cathode 56 or the cathodes 16 can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Encapsulation

Most OLED devices and displays are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

The invention has been described in detail with particular reference to certain preferred embodiments thereof, but it will be understood that variations and modifications can be effected within the spirit and scope of the invention. For example, rather than using organic materials, inorganic materials can also be used in accordance with the present invention.

Parts List 10 single-color or monochrome passive matrix OLED device or display
10-3C three-color or full-color passive matrix OLED display
11 OLED display substrate
12 light-transmissive first electrodes or anodes
13 organic hole-injecting and hole-transporting layer (HTL)
14 organic light-emitting layer (LEL)
14a vaporizable organic material(s)
14R organic red-light-emitting layer
14G organic green-light-emitting layer
14B organic blue-light-emitting layer
15 organic electron-transporting layer (ETL)
16 second electrodes or cathodes
18 encapsulation or cover
50-3C three-color or full-color active matrix OLED display
51 OLED display substrate
52 light-transmissive first electrode pads or anode pads
53 organic hole-injecting and hole-transporting layer
54R organic red-light-emitting layer
54G organic green-light-emitting layer
54B organic blue-light-emitting layer
55 organic electron-transporting layer
56 common second electrode or cathode
61-1 transistors, capacitor, and electrical wiring (in sub-pixel 1;1)
62-2 transistors, capacitor, and electrical wiring (in sub-pixel 1;2)
61-3 transistors, capacitor, and electrical wiring (in sub-pixel 1;3)

Parts List (Con't)

64 conductive wiring
66 light-transmissive organic insulator layer
68 organic insulator layer
87 X-direction driving circuit
88 Y-direction driving circuit
100 OLED apparatus
102 buffer hub
103 unload station
104 transfer hub
105 connector port
106 vacuum pump
107 pumping port
108 pressure gauge
110 load station
110C chamber
110H housing
111 carrier (for substrates or structures)
130 vapor deposition station (organic HTL)
140 vapor deposition station (organic LEL)
140C chamber
140H housing
141 station valve
142 station vacuum pump
144 station pumping port
145 throttle valve
146 station pressure sensor Parts List (con't)

147 inert gas supply
148 conduit
149 gas flow controller
150 vapor deposition station (organic ETL)
160 vapor deposition station (second electrodes)
170 storage station
180 encapsulation station
210 lead screw drive motor
211 lead screw shaft
211a shaft seal
212 lead screw
213 lead screw shaft termination bracket
214 lead screw follower
216 switch
217 lead
218 input terminal
220 stepper motor for indexing in y-direction
221 computer for indexing in y-direction
222 drive shaft
223 shaft seal
224 shaft coupling
225 glide shoe
225R glide rail
226 coupling lifter
230 holder or mask frame
232 alignment tab(s)
233 alignment window(s)

Parts List (con't)

234 alignment detector
235 optical window
236 optical alignment axis
238 shutter 500 vapor deposition apparatus
500M manifold
500MA manifold assembly
500MB manifold for providing blue light-emitting organic material vapor
500MG manifold for providing green light-emitting organic material vapor
500MR manifold for providing red light-emitting organic material vapor
500IGS inert gas supply
500VS organic material vapor source
500VS1 organic material vapor source
500VS2 organic material vapor source
500VS3 organic material vapor source
500VS4 organic material vapor source
500CM cylindrical tubular manifold
500CM-1 modified cylindrical tubular manifold
502 manifold housing
504 structure or nozzle plate
504C curved structure or curved nozzle plate
504T structure or nozzle plate for two-dimensional nozzle array
506 nozzles
506B nozzles in manifold 500MB
506G nozzles in manifold 500MG
506R nozzles in manifold 500MR Parts List (con't)

510 directed beam(s) of organic material vapor(s) and inert gas
520 manifold heating element(s)
530 thermally insulative manifold support
532 gasket
533 alignment mark(s) on nozzle plate (504)
535 alignment mark(s) on cylindrical tubular manifold (500CM)
536 cylindrical manifold housing
537 slit-shaped aperture in cylindrical manifold housing (536)
538 end cap
539 end cap
540 housing of vapor source (500VS)
541 flange
542 gasket
543 bolt(s)
544 source cover
545 seal
546a lower vapor transport conduit
546b upper vapor transport conduit
546c common conduit for vapor transport and gas transport
547c common conduit for vapor transport from one vapor source and for gas transport
550 vaporization heater
552 feedthrough
554 feedthrough
560g gas flow control device
560v vapor flow control device
562 gas shut-off valve cl Parts Lists (con't)
564 inert gas preheater
566a lower gas transport conduit
566b upper gas transport conduit
570 combiner
600 heatable enclosure
750 vaporization heater power supply
750R regulator
752 lead
753 current meter
754 lead
$\propto$ angle subtending vapor stream issuing from nozzles (506)
CL center line of line of nozzles
D spacing between substrate (11;51) and nozzles (506)
d inside dimension or diameter of nozzles (506)
l length dimension of nozzles (506)
EL organic electroluminescent or electroluminescence medium
"F" forward motion of substrate
"R" reverse or return motion of substrate
"I" starting position of substrate
"II" end position of forward motion and beginning position of reverse motion of substrate
pix pixel
$P_c$ reduced pressure in chamber (140C)
$P_G$ inert gas pressure in manifold (500M)

Parts List (con't)

$P_V$ vapor pressure of organic material(s) in manifold (500M) $P_v+P_g$ combined pressure in manifold (500M) of inert gas and organic material vapor(s)
s nozzle pitch or spacing between nozzles in a nozzle plate (504)
$T_e$ temperature within heatable enclosure (600)
x motion in x-direction of substrate (11;51)
y indexed motion in y-direction of substrate (11;51)
m columns of nozzles (506) of two-dimensional array of nozzles (504T)
n rows of nozzles (506) of two-dimensional array of nozzles (504T)
Xn X-direction signal lines where n is an integer
Ym Y-direction signal lines where m is an integer
Vddn power supply lines
TSnm thin-film transistors for switching
TCnm thin-film transistors for power control
ELnm organic electroluminescent medium in each pixel or sub-pixel
Cnm thin-film capacitors

What is claimed is:

1. A device for depositing one or more organic materials onto an OLED display substrate, comprising:
    a) a manifold and an OLED display substrate in a chamber at reduced pressure and spaced relative to each other;
    b) a structure sealingly covering one surface of the manifold, the structure including a plurality of nozzles extending through the structure into the manifold, and the nozzles being spaced from each other in correspondence with the pattern of organic material to be deposited onto the OLED display substrate;

c) means for providing vaporized organic material into the manifold; and d) means for applying an inert gas under pressure into the manifold so that the inert gas provides a viscous gas flow through each of the nozzles, such viscous gas flow transporting at least portions of the vaporized organic materials from the manifold through the nozzles to provide directed beams of the inert gas arid of the vaporized organic materials and projecting the collimated beams onto the OLED display substrate for depositing the organic materials in a striped pattern on the substrate.

2. The device of claim 1 wherein the structure is formed from a material selected from the group consisting of metals, glass, quartz, graphite and ceramics, the plurality of nozzles in the structure define a circular outline or a polygonal outline, and the nozzles are spaced from each other corresponding to a first color-forming pattern of organic materials to be deposited on the OLED display substrate.

3. The device of claim 2 wherein the inside dimension of each nozzle in the structure is in a range from 10 to 1000 micrometer, and the length dimension of each nozzle extending through the structure is at least 5 times larger than a selected nozzle inside dimension.

4. The device of claim 3 wherein the structure is a plate or a tube.

5. A new use for a structure including a plurality of nozzles extending through the structure, and the nozzles being spaced from each other in correspondence with a striped pattern to be deposited onto an OLED display substrate so that vaporized organic material is transported through the nozzles and deposited onto the OLED display substrate in the striped pattern.

6. A device for depositing vaporized material from a manifold onto a surface, comprising:

a) means for providing vaporized material in a manifold of reduced pressure;

b) means for providing a structure sealingly covering one surface of the manifold, the structure including a plurality of nozzles extending through the structure into the manifold, and the nozzles being spaced from each other in correspondence with a striped pattern to be deposited onto the surface; and c) means for applying an inert gas under pressure into the manifold so that the inert gas provides a viscous gas flow through each of the nozzles, such viscous gas flow transporting at least portions of the vaporized material from the manifold through the nozzles to provide directed beams of the inert gas and of the vaporized material and projecting the directed beams onto the surface.

7. The device of claim 6 wherein the structure is formed from a material selected from the group consisting of metals, glass, quartz, graphite and ceramics, the plurality of nozzles in the structure define a circular outline or a polygonal outline, and the nozzles are spaced from each other corresponding to a first pattern of a first vaporizable material or mixture of materials to be deposited on the surface.

8. The device of claim 7 wherein the inside dimension of each nozzle in the structure is in a range from 10 to 1000 micrometer, and the length dimension of each nozzle extending through the structure is at least S times larger than a selected nozzle inside dimension.

9. The device of claim 8 wherein the structure is a plate or a tube.

10. A plurality of devices each for simultaneously depositing one or more organic materials onto an OLED display substrate, each device comprising:

a) a manifold and an OLED display substrate in a chamber at reduced pressure and spaced relative to each other;

b) a structure sealingly covering one surface of the manifold, the structure including a plurality of nozzles extending through the structure into the manifold, and the nozzles being spaced from each other in correspondence with the pattern of organic material to be deposited onto the OLED display substrate;

c) means for providing vaporized organic material into the manifold; and d) means for applying an inert gas under pressure into the manifold so that the inert gas provides a viscous gas flow through each of the nozzles, such viscous gas flow transporting at least portions of the vaporized organic materials form the manifold through the nozzles to provide directed beams of the inert gas and of the vaporized organic materials and projecting the directed beams onto the OLED display substrate for depositing the organic materials in a striped pattern on the substrate.

* * * * *